(12) United States Patent
Kim et al.

(10) Patent No.: US 12,207,468 B2
(45) Date of Patent: Jan. 21, 2025

(54) SEMICONDUCTOR MEMORY DEVICE AND METHOD OF FABRICATING THE SAME

(71) Applicant: Samsung Electronics Co., Ltd., Suwon-si (KR)

(72) Inventors: Seung Yoon Kim, Seoul (KR); Sang Hun Chun, Suwon-si (KR); Jee Hoon Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 387 days.

(21) Appl. No.: 17/681,247

(22) Filed: Feb. 25, 2022

(65) Prior Publication Data

US 2022/0399367 A1 Dec. 15, 2022

(30) Foreign Application Priority Data

Jun. 10, 2021 (KR) ........................ 10-2021-0075217

(51) Int. Cl.
| | |
|---|---|
| *H01L 21/00* | (2006.01) |
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |
| *H10B 43/27* | (2023.01) |
| *H10B 43/35* | (2023.01) |
| *H10B 43/40* | (2023.01) |

(52) U.S. Cl.
CPC ............. *H10B 43/27* (2023.02); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 43/27; H10B 41/10; H10B 43/35; H10B 41/35; H10B 41/40; H10B 43/40; H10B 43/10; H10B 41/27
See application file for complete search history.

(56) References Cited

U.S. PATENT DOCUMENTS

| | | |
|---|---|---|
| 8,552,489 B2 | 10/2013 | Eom et al. |
| 8,729,622 B2 | 5/2014 | Moon et al. |
| 8,847,302 B2 | 9/2014 | Alsmeier et al. |
| 9,666,592 B2 | 5/2017 | Yun et al. |
| 9,905,572 B2 | 2/2018 | Lee |

(Continued)

*Primary Examiner* — Richard A Booth
(74) *Attorney, Agent, or Firm* — Harness, Dickey & Pierce, P.L.C.

(57) ABSTRACT

A semiconductor memory device includes a cell unit including a stack structure and a channel structure penetrating through the stack structure, the stack structure including at least one string selection gate and a plurality of cell gates, cell separation structures separating the cell unit in a first direction, and gate cutting structures defining regions within the cell unit between adjacent cell separation structures. The cell unit includes a first region defined between a first cell separation structure and a first gate cutting structure and a second region defined between the first gate cutting structure and a second gate cutting structure. A ratio of a region of the at least one string selection gate that is occupied by a conductive material in the second region is greater than a ratio of a region of at least one cell gate that is occupied by the conductive material in the second region.

20 Claims, 28 Drawing Sheets

(56) References Cited

U.S. PATENT DOCUMENTS

| | | |
|---|---|---|
| 10,170,323 B2 | 1/2019 | Hudson et al. |
| 2020/0203329 A1* | 6/2020 | Kanamori ............... H01L 24/09 |
| 2020/0395375 A1 | 12/2020 | Huo et al. |
| 2021/0288067 A1* | 9/2021 | Kanamori .............. H10B 43/40 |
| 2021/0408040 A1* | 12/2021 | Kang ..................... H10B 41/27 |
| 2022/0189876 A1* | 6/2022 | Lim ....................... H10B 43/10 |
| 2022/0359563 A1* | 11/2022 | Noh ....................... H10B 43/40 |

* cited by examiner

SEMICONDUCTOR MEMORY DEVICE AND METHOD OF FABRICATING THE SAME

CROSS-REFERENCE TO RELATED APPLICATION

This application claims priority under 35 U.S.C. § 119 from Korean Patent Application No. 10-2021-0075217 filed on Jun. 10, 2021 in the Korean Intellectual Property Office, and all the benefits accruing therefrom under 35 U.S.C. 119, the contents of which in its entirety are herein incorporated by reference.

BACKGROUND

1. Technical Field

The present inventive concepts relate to a semiconductor memory device and a method of fabricating the same, and more particularly, to a three-dimensional semiconductor memory device including a vertical channel structure and having improved electrical characteristics, and a method of fabricating the same.

2. Description of the Related Art

In order to satisfy high performance and low price demanded by consumers, a degree of integration of semiconductor memory devices has increased. In a case of a two-dimensional or planar semiconductor memory device, a degree of integration of the semiconductor memory device is determined by an area occupied by a unit memory cell. Accordingly, a three-dimensional semiconductor memory device in which unit memory cells are vertically disposed has been recently developed.

In addition, in order to improve a degree of integration of semiconductor elements, the number of layers of word lines and the number of channel holes vertically stacked in a semiconductor memory device have increased. Accordingly, research into a multi-stack structure in which a plurality of stack structures are stacked has been conducted.

Meanwhile, as the number of channel structures of the three-dimensional semiconductor memory device increases, a region in which a conductive material is not filled in a region of the word line increases, such that resistance characteristics of a component are deteriorated.

SUMMARY

Aspects of the present inventive concepts provide a semiconductor memory device capable of securing resistance characteristic of a component even though the number of channel structures is increased.

Aspects of the present inventive concepts also provide a method of fabricating a semiconductor memory device capable of securing resistance characteristic of a component even though the number of channel structures is increased.

According to some example embodiments of the present inventive concepts, a semiconductor memory device may include a cell unit including a stack structure and a channel structure penetrating through the stack structure, the stack structure being on a substrate, the stack structure extending in a first direction, the stack structure including at least one string selection gate and a plurality of cell gates. The semiconductor memory device may include a plurality of cell separation structures separating the cell unit in the first direction, and a plurality of gate cutting structures defining regions within the cell unit between adjacent cell separation structures of the plurality of cell separation structures. The cell unit may include a first region defined between a first cell separation structure of the plurality of cell separation structures and a first gate cutting structure of the plurality of gate cutting structures, and a second region defined between the first gate cutting structure and a second gate cutting structure of the plurality of gate cutting structures, the first and second gate cutting structures being adjacent gate cutting structures. A ratio of a region of the at least one string selection gate that is occupied by a conductive material in the second region is greater than a ratio of a region of at least one cell gate of the plurality of cell gates that is occupied by the conductive material in the second region.

According to some example embodiments of the present inventive concepts, a semiconductor memory device may include a cell unit including upper and lower stack structures and a channel structure penetrating through the upper and lower stack structures in a first direction, the upper and lower stack structures being on a substrate, the upper and lower stack structures each extending in a second direction intersecting the first direction, each of the upper stack structure and the lower stack structure including gate electrode layers including at least one string selection gate and a plurality of cell gates. The semiconductor memory device may include a plurality of cell separation structures separating the cell unit in the second direction, and a plurality of gate cutting structures defining regions within the cell unit between adjacent cell separation structures of the plurality of cell separation structures. A side surface of the at least one string selection gate of the upper stack structure may at least partially define a recess between the at least one string selection gate and one gate cutting structure of the plurality of cell separation structures. The recess may be filled with an insulating material.

According to some example embodiments of the present inventive concepts, a method of fabricating a semiconductor memory device may include forming a first preliminary stack structure on a substrate, the first preliminary stack structure extending in a first direction and having first inter-electrode insulating layers and first sacrificial layers that are alternately stacked. The method may include forming first channel holes penetrating through the first preliminary stack structure in a second direction that intersects the first direction. The method may include forming a second preliminary stack structure on the first preliminary stacked structure, the second preliminary stack structure having second inter-electrode insulating layers and second sacrificial layers that are alternately stacked. The method may include forming second channel holes penetrating through the second preliminary stack structure in the second direction. The method may include forming a plurality of cell separation structures penetrating through both the first and second preliminary stack structures and separating a cell unit in the first direction. The method may include removing the first and second sacrificial layers to form first gate electrode layers and second preliminary gate electrode layers. The method may include forming a plurality of gate cutting structure trenches cutting the second preliminary gate electrode layers to define regions within the cell unit between the plurality of cell separation structures. The method may include removing at least portions of the second preliminary gate electrode layers cut by each of the plurality of gate cutting structure trenches to expose the second inter-electrode insulating layers. The method may include forming a conductive material on the exposed second inter-electrode insulating layers. The method may include forming second gate electrode layers so that conductive materials of respective second gate electrode layers are spaced apart from each other in the second direction. The method may include forming a plurality of gate cutting structures in the plurality of gate cutting structure trenches, such that the regions within the cell unit include a first region defined between a first cell separation structure of the plurality of cell separation structures and a first gate cutting structure of the plurality of gate cutting structures, and a second region defined between the first gate cutting structure and a second gate cutting structure of the plurality of gate cutting structures, the first and second gate cutting structures being adjacent gate cutting structures. The second gate electrode layers may include at least one string selection gate and a plurality of cell gates. A ratio of a region of the at least one string selection gate that is occupied by the conductive material in the second region may be greater than a ratio of a region of at least one cell gate of the plurality of cell gates that is occupied by the conductive material in the second region.

However, aspects of the present inventive concepts are not restricted to the one set forth herein. The above and other aspects of the present inventive concepts will become more apparent to one of ordinary skill in the art to which the present inventive concepts pertains by referencing the detailed description of the present inventive concepts given below.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF THE EMBODIMENTS

Figure 1:
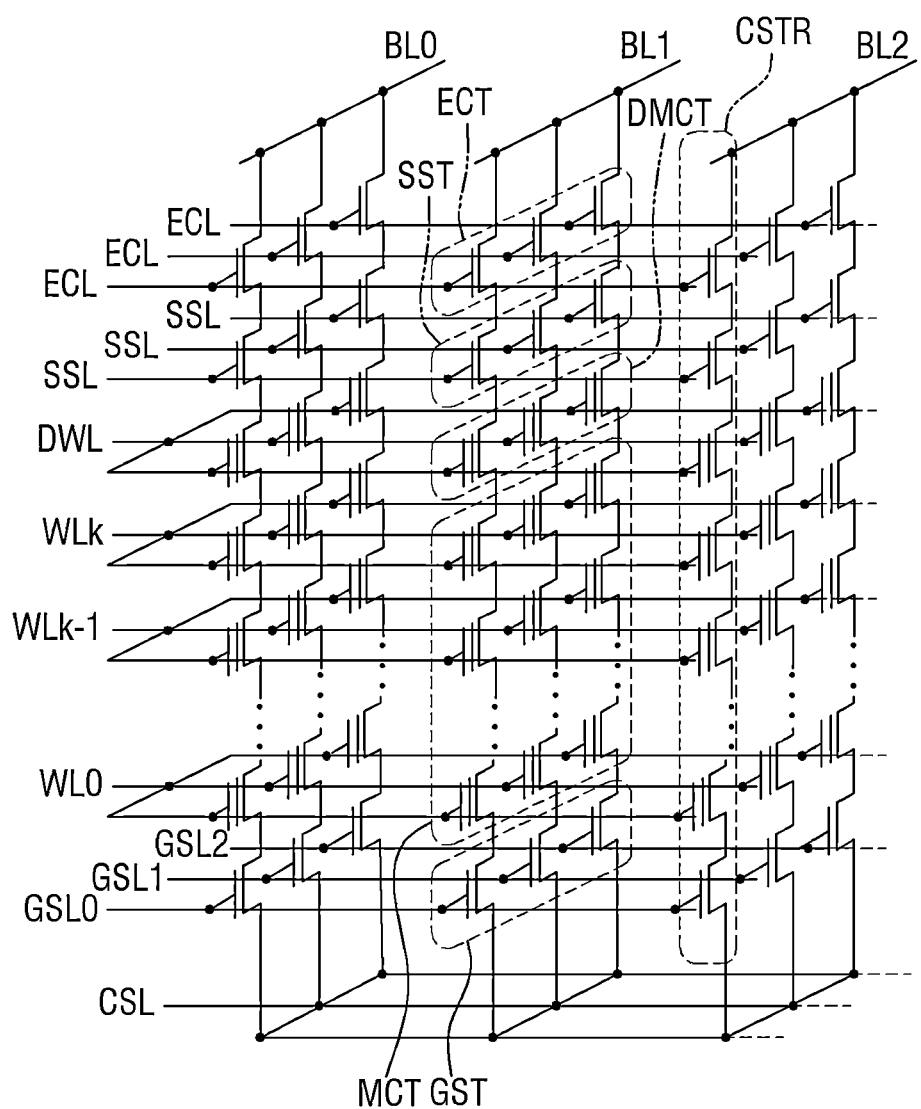
FIG. 1 is an example circuit diagram illustrating a semiconductor memory device according to some example embodiments.

Hereinafter, some example embodiments of the present inventive concepts will be described in detail with reference to the accompanying drawings. In the drawings, the same components are denoted by the same reference numerals, and redundant description thereof will be omitted.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is an example circuit diagram illustrating a semiconductor memory device according to some example embodiments.

Referring to FIG. 1, a memory cell array of a semiconductor memory device according to some example embodiments may include a common source line CSL, a plurality of bit lines BL0 to BL2, and a plurality of cell strings CSTR disposed between the common source line CSL and the bit lines BL0 to BL2.

The plurality of cell strings CSTR may be connected to each of the bit lines BL0 to BL2 in parallel. The plurality of cell strings CSTR may be commonly connected to a common source line CSL. That is, the plurality of cell strings CSTR may be disposed between the plurality of bit lines BL0 to BL2 and one common source line CSL. A plurality of common source lines CSL may be two-dimensionally arranged. Here, the electrically same voltage may be applied to the common source lines CSL, or each of the common source lines CSL may be electrically controlled.

For example, each of the cell strings CSTR may include a string selection transistor SST, memory cells MCT connected to each other in series, and a ground selection transistor GST. In addition, each of the memory cells MCT includes a data storage element.

As an example, each of the cell strings CSTR may include a string selection transistor SST connected to the bit lines BL0 to BL2 in series. The ground selection transistor GST may be connected to the common source line CSL. The memory cells MCT may be connected in series between the string selection transistor SST and the ground selection transistor GST.

Furthermore, each of the cell strings CSTR may further include a dummy cell DMCT connected between the string selection transistor SST and the memory cell MCT.

Although not illustrated in the drawing, the dummy cell DMCT may also be connected between the ground selection transistor GST and the memory cell MCT. As another example, the ground selection transistor GST in each of the cell strings CSTR may be composed of a plurality of metal oxide semiconductor (MOS) transistors connected to each other in series. As still another example, each of the cell strings CSTR may include a plurality of string selection transistors connected to each other in series. As yet still another example, each of the cell strings CSTR may further include an erase control transistor ECT disposed between the bit lines BL0 to BL2 and the string selection transistor SST. The erase control transistor ECT may be connected to the string selection transistor SST in series.

According to some example embodiments, the string selection transistor SST may be controlled by a string selection line SSL. The memory cells MCT may be controlled by a plurality of word lines WL0 to WLk, and the dummy cells DMCT may be controlled by a dummy word line DWL. In addition, the ground selection transistor GST may be controlled by a ground selection line GSL. The common source line CSL may be commonly connected to sources of the ground selection transistors GST.

One cell string CSTR may include a plurality of memory cells MCT having different distances from the common source lines CSL. In addition, a plurality of word lines WL0 to WLk and DWL may be disposed between the common source lines CSL and the bit lines BL0 to BL2.

Gate electrodes of the memory cells MCT which are disposed at substantially the same distance from the common source lines CSL may be commonly connected to one of the word lines WL0 to WLk and DWL to be in an equipotential state. Alternatively, although the gate electrodes of the memory cells MCT are disposed at substantially the same level from the common source lines CSL, the gate electrodes disposed in different rows or columns may be independently controlled.

The ground selection lines GSL0 to GSL2 and the string selection lines SSL may extend in the same direction as the word lines WL0 to WLk and DWL, for example. The ground selection lines GSL0 to GSL2 and the string selection line SSL disposed at substantially the same level from the common source lines CSL may be electrically separated from each other.

When the cell string CSTR includes the erase control transistor ECT, the erase control transistors may be controlled by an erase control line ECL. The erase control transistors ECT generate gate induced drain leakage (GIDL) at the time of an erase operation of the memory cell array. That is, the erase control transistors ECT may be GIDL transistors.

Figure 2:
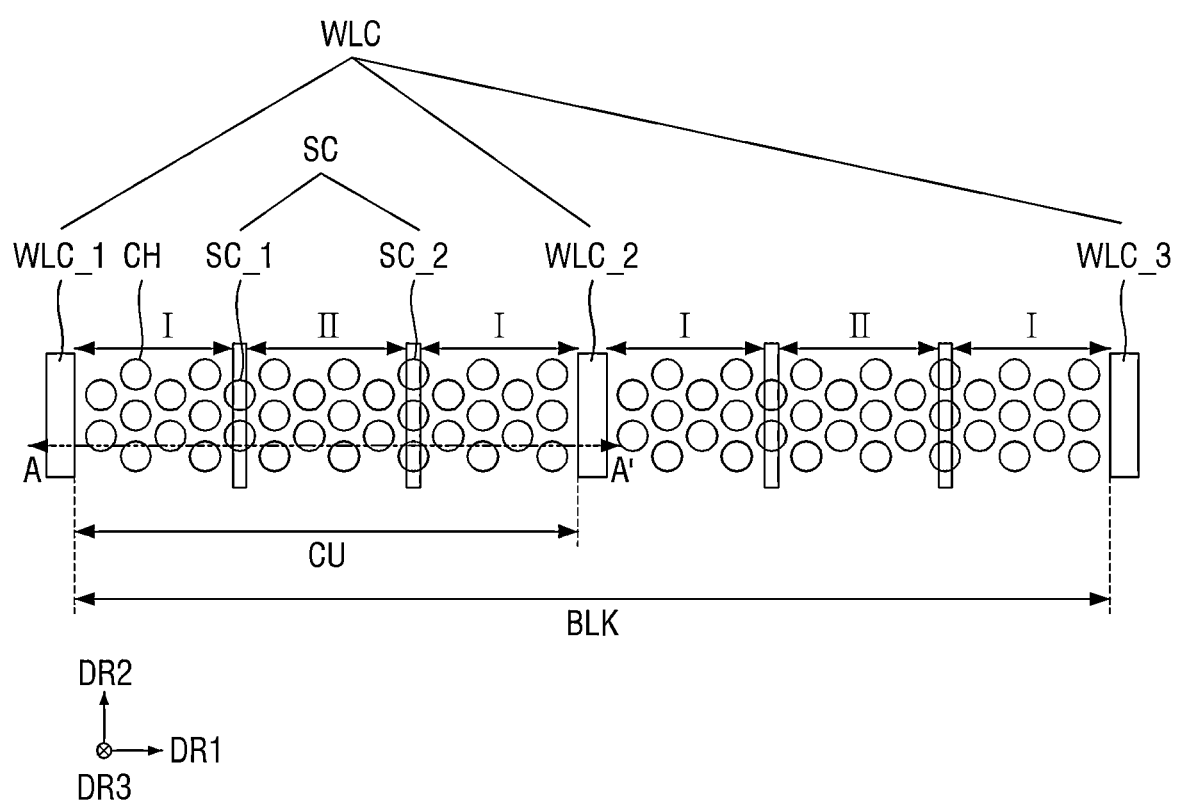
FIG. 2 is a schematic layout diagram for describing the semiconductor memory device according to some example embodiments.
Figure 3:
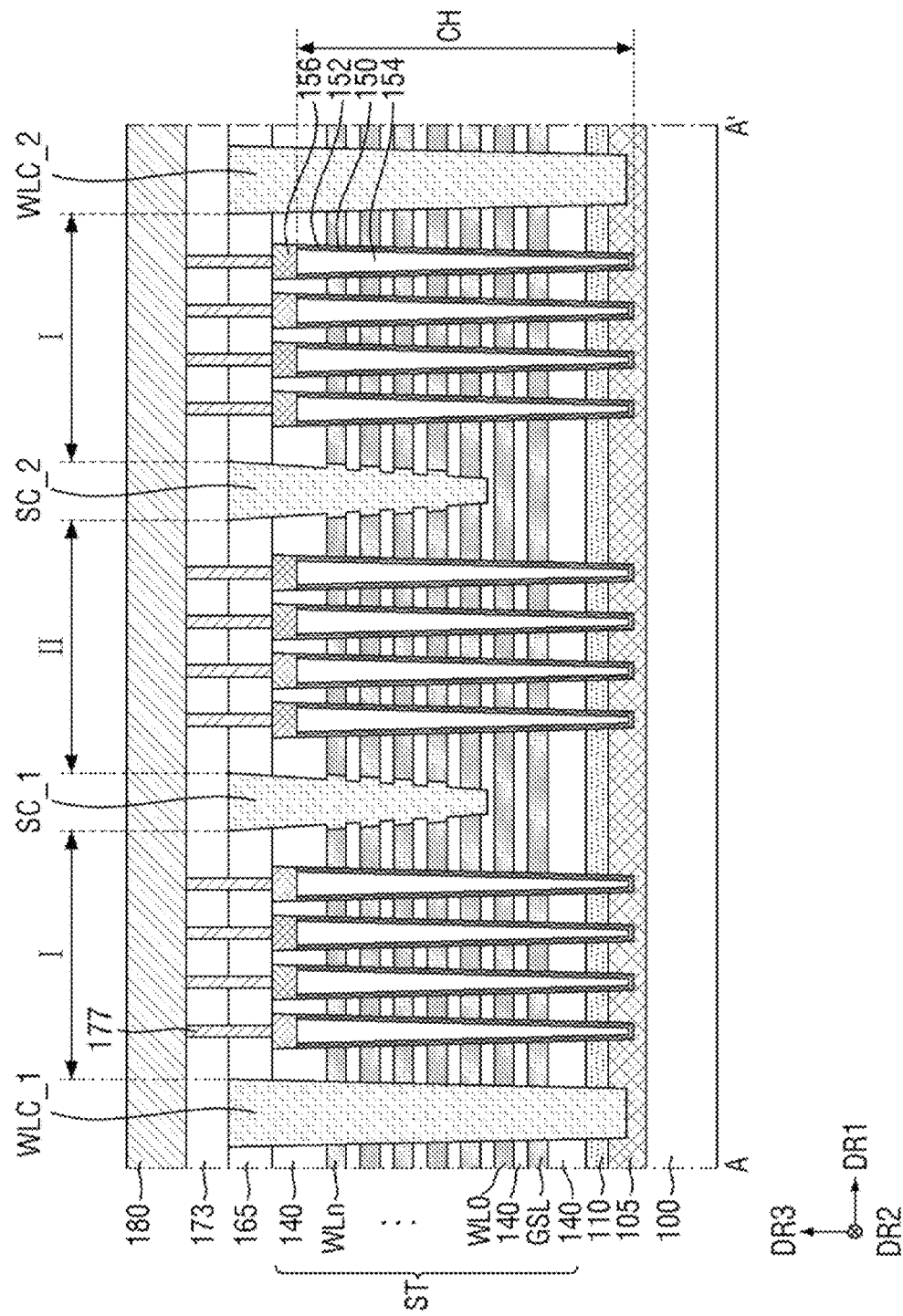
FIG. 3 is a schematic cross-sectional view taken along line A-A' of FIG. 2.
Figure 4:
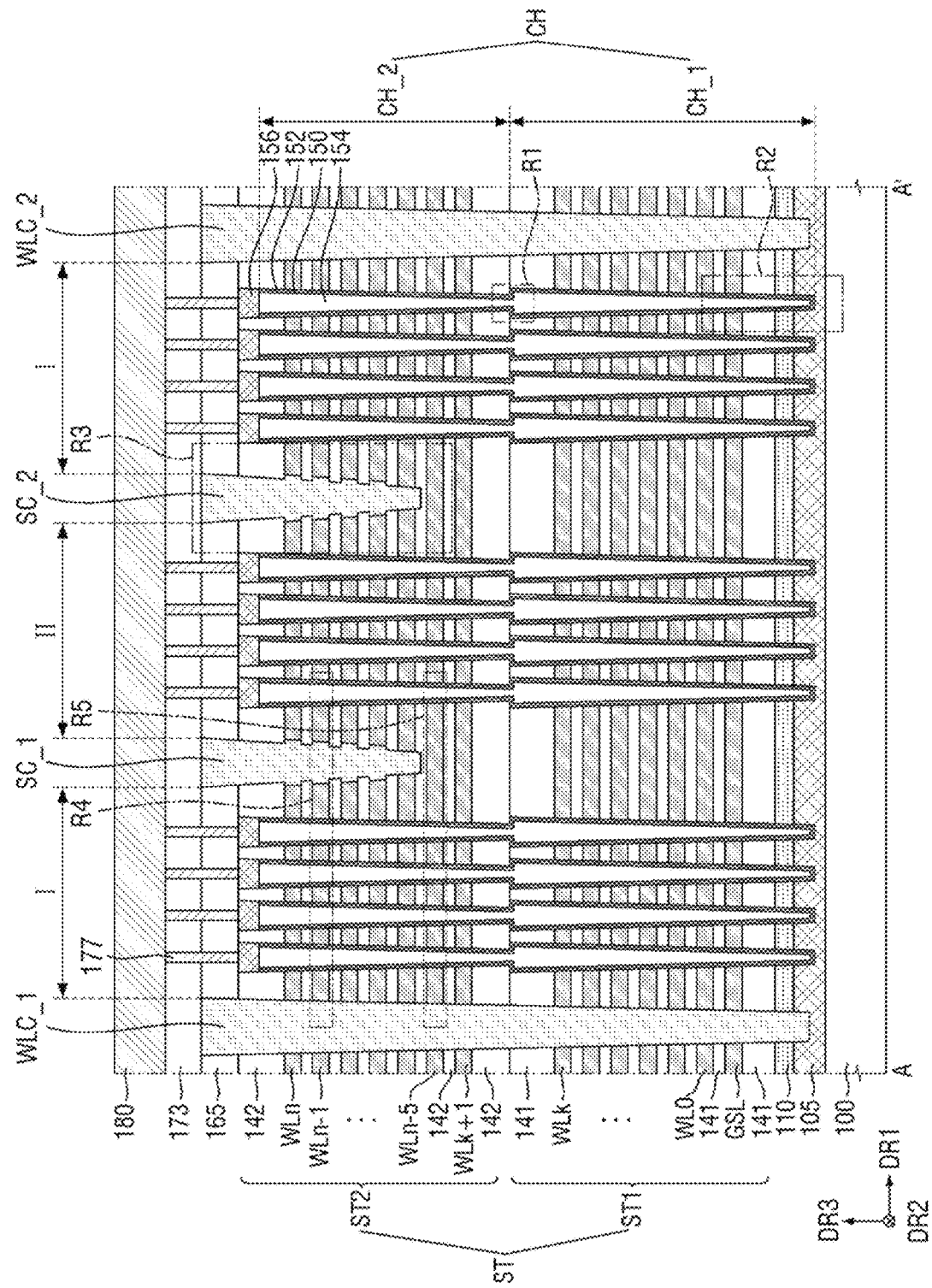
FIG. 4 is a view for describing a semiconductor memory device according to some example embodiments, and is a view corresponding to the cross-sectional view taken along line A-A' of FIG. 2.
Figure 5:
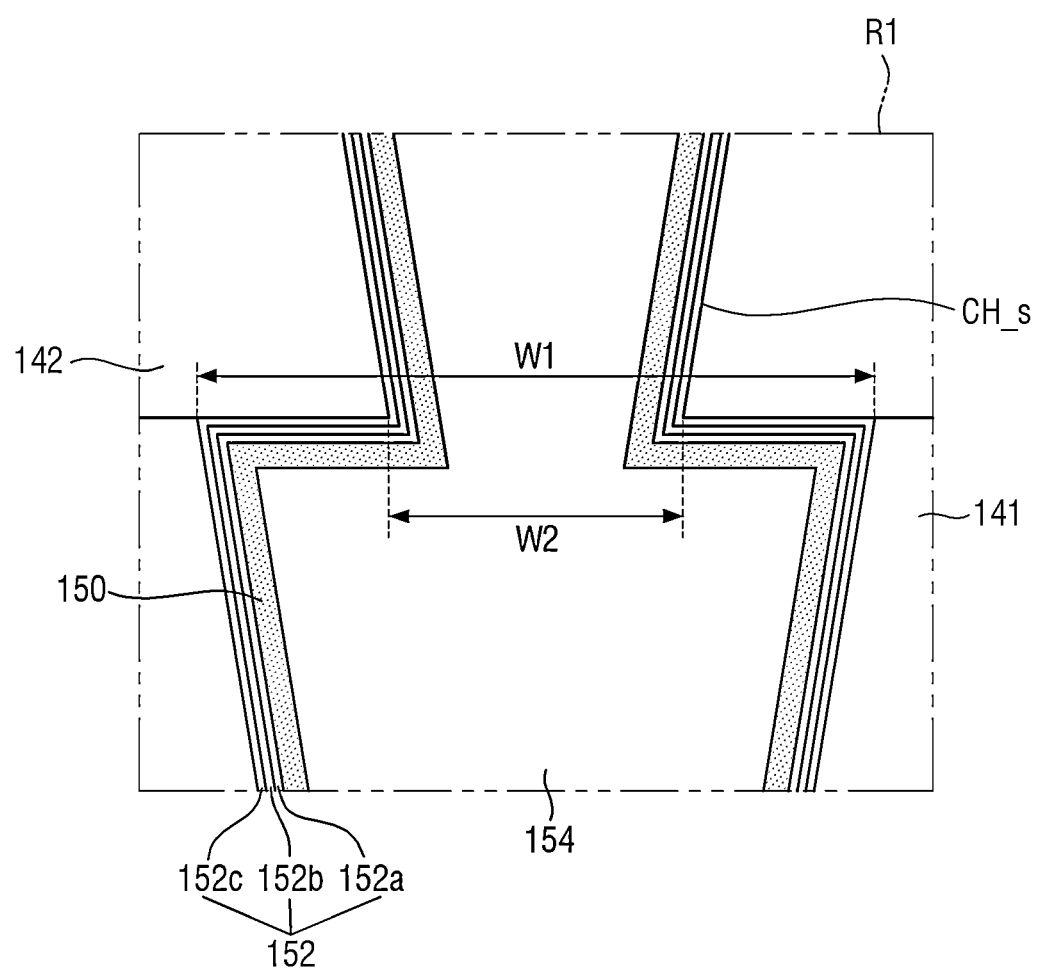
FIG. 5 is an enlarged view of R1 of FIG. 4.
Figure 6:
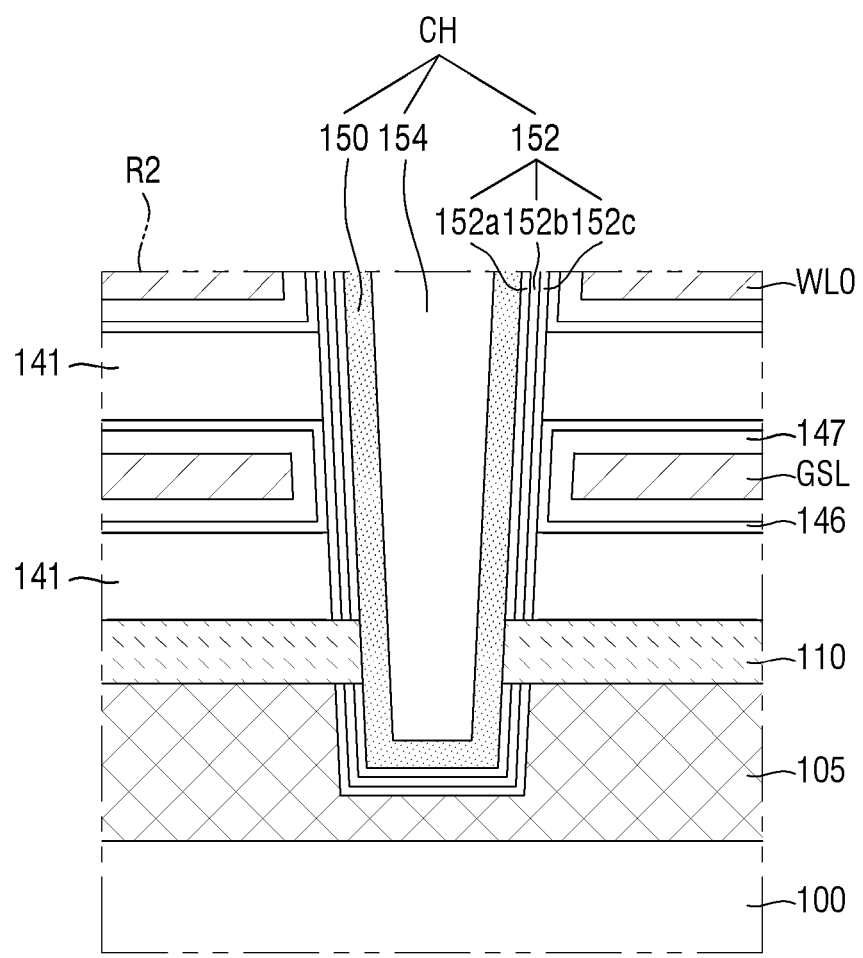
FIG. 6 is an enlarged view of R2 of FIG. 5.
Figure 7:
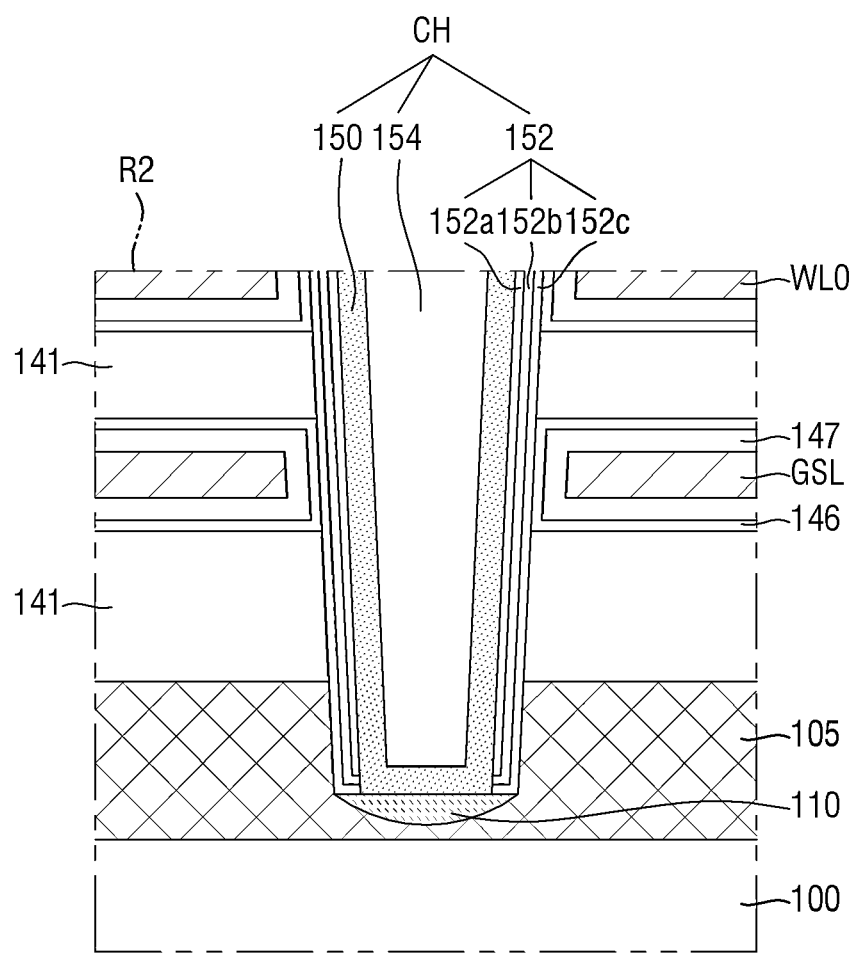
FIG. 7 is a view for describing the semiconductor memory device according to some example embodiments, and is a view corresponding to the enlarged view of R2 of FIG. 4.
Figure 8:
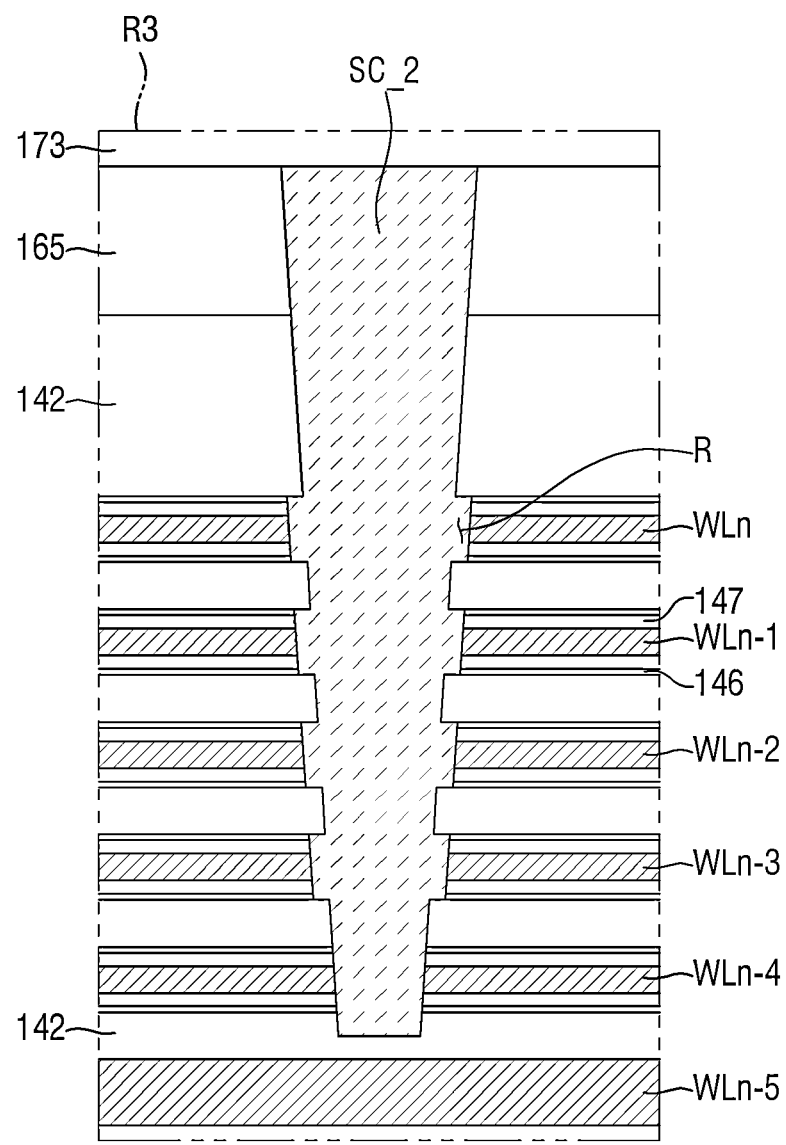
FIG. 8 is an enlarged view of R3 of FIG. 4.
Figure 9:
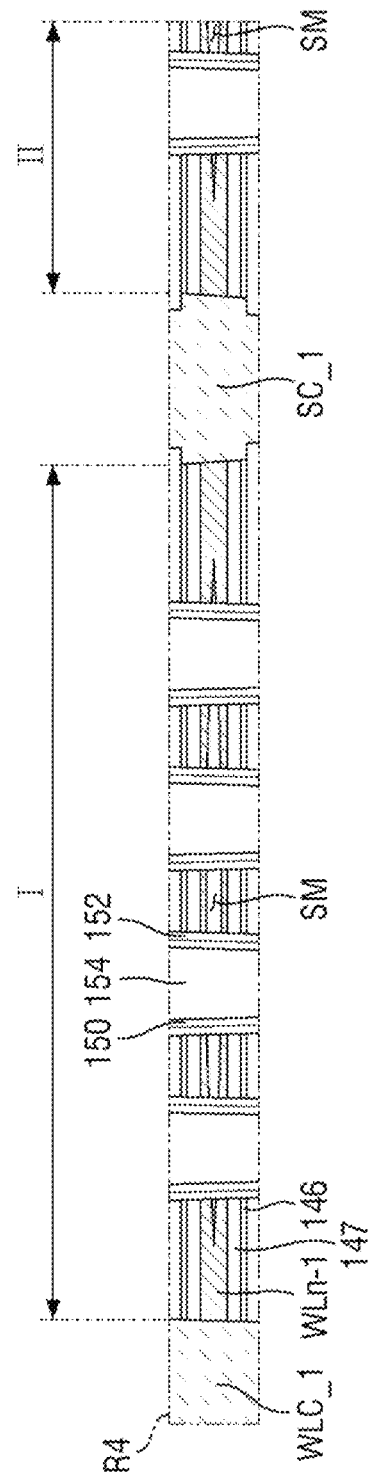
FIG. 9 is an enlarged view of R4 of FIG. 4.
Figure 10:
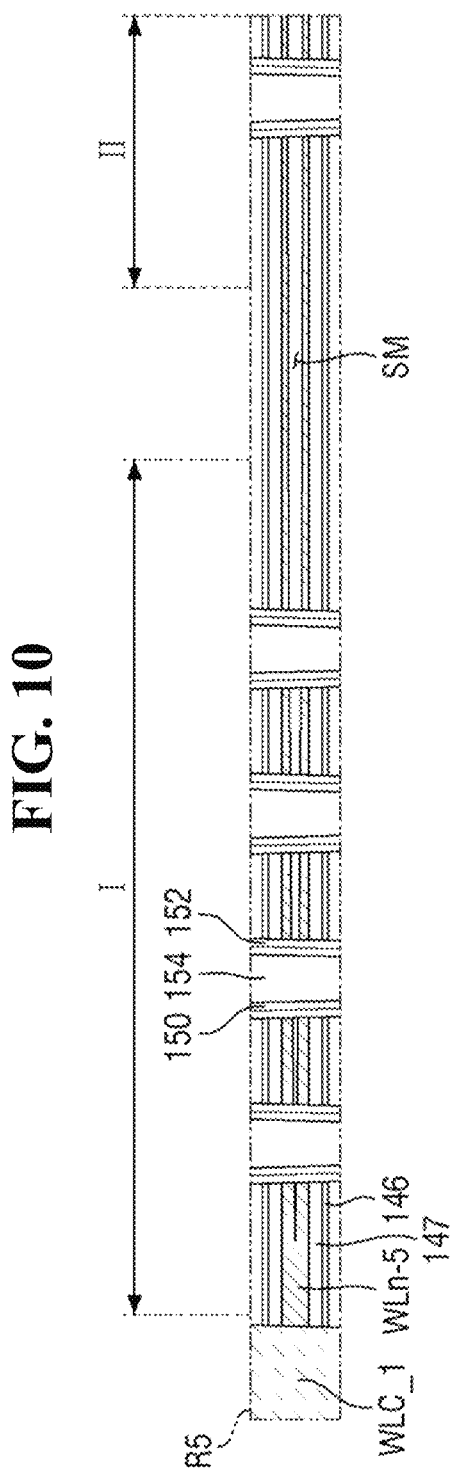
FIG. 10 is an enlarged view of R5 of FIG. 4.

FIG. 2 is a schematic layout diagram for describing the semiconductor memory device according to some example embodiments. FIG. 3 is a schematic cross-sectional view taken along line A-A' of FIG. 2. FIG. 4 is a view for describing a semiconductor memory device according to some example embodiments, and is a view corresponding to the cross-sectional view taken along line A-A' of FIG. 2. FIG. 5 is an enlarged view of R1 of FIG. 4. FIG. 6 is an enlarged view of R2 of FIG. 5. FIG. 7 is a view for describing the semiconductor memory device according to some example embodiments, and is a view corresponding to the enlarged view of R2 of FIG. 4. FIG. 8 is an enlarged view of R3 of FIG. 4. FIG. 9 is an enlarged view of R4 of FIG. 4. FIG. 10 is an enlarged view of R5 of FIG. 4.

Referring to FIGS. 2 to 10, the semiconductor memory device according to some example embodiments may include a cell unit CU, a cell separation structure WLC, and a gate cutting structure SC.

The substrate 100 may be a bulk silicon or a silicon-on-insulator (SOI). Alternatively, the substrate 100 may be a silicon substrate or may include other materials such as silicon germanium, silicon germanium on insulator (SGOI), indium antimonide, lead tellurium compound, indium arsenide, indium phosphide, gallium arsenide, or gallium antimonide, but is not limited thereto.

A common source plate 105 may be disposed on the substrate 100. The common source plate 105 may serve as the common source line CSL of FIG. 1.

The common source plate 105 may include at least one of a conductive semiconductor film, a metal silicide film, and a metal film. When the common source plate 105 includes the conductive semiconductor film, the common source plate 105 may include, for example, at least one of silicon (Si), germanium (Ge), silicon germanium (SiGe), gallium arsenide (GaAs), indium gallium arsenide (InGaAs), aluminum gallium arsenide (AlGaAs), or combinations thereof. The common source plate 105 may have a crystal structure including at least one of a single crystal structure, an amorphous structure, and a polycrystalline structure. The common source plate 105 may include at least one of a p-type impurity, an n-type impurity, and carbon included in the semiconductor film.

A support semiconductor layer 110 may be disposed on the common source plate 105. The support semiconductor layer 110 may include, for example, polysilicon, but is not limited thereto. The support semiconductor layer 110 may include, for example, a semiconductor material such as silicon (Si), germanium (Ge), or mixtures thereof.

The cell unit CU includes a stack structure ST. The stack structure ST may be disposed on the common source plate 105 and thus may be on the substrate 100 and may extend in the first direction DR1. The stack structure ST may include a plurality of conductive lines GSL, WL0 to WLk, DWL, SSL, and MCL and a plurality of inter-electrode insulating layers 140 that are alternately stacked in a third direction DR3. As shown, the cell unit CU may further include a channel structure CH penetrating through the stack structure ST.

The inter-electrode insulating layers 140 are disposed between the conductive lines GSL, WL0 to WLk, DWL, SSL, and MCL spaced apart from each other in the third direction DR3 direction, respectively. For example, each of the plurality of conductive lines GSL, WL0 to WLk, DWL, SSL, and MCL and each of the inter-electrode insulating layers 140 may have a laminar structure in which they extend in a first direction DR1 and a second direction DR2. The inter-electrode insulating layer 140 may include an insulating material.

The plurality of conductive lines GSL, WL0 to WLk, DWL, SSL, and MCL may include a ground selection line GSL, a plurality of word lines WL0 to WLk, a dummy word line DWL, at least one string selection line SSL, and at least one erase control line MCL. The ground selection line GSL, the plurality of word lines WL0 to WLk, the dummy word line DWL, the string selection line SSL, and the erase control line MCL may be sequentially stacked on the substrate 100.

Referring to FIG. 3, only six word lines WL0 to WLn are illustrated on the ground selection line GSL, but this is only for convenience of explanation and the present inventive concepts are not limited thereto.

In some example embodiments, the erase control line ECL may be at least one of gate electrode layers WLn, WLn-1, and WLn-2 (see FIG. 8) disposed at the uppermost portion among a plurality of gate electrode layers GSL and WL0 to WLn. The string selection line SSL may be at least one of gate electrode layers WLn-1, WLn-2, WLn-3, and WLn-4 (see FIG. 8) disposed below the erase control line ECL.

The plurality of gate electrode layers GSL and WL0 to WLn may include at least one string selection gate electrode layer and a plurality of cell gate electrode layers. That is, the cell gate electrode layers may refer to the remaining gate electrode layers WLn-5 and WLk+1 (see FIG. 4) except for the string selection line SSL among the gate electrode layers GSL and WL0 to WLn. A "string selection line" as described herein may be interchangeably referred to as a string selection gate, and a "cell gate electrode layer" as described herein may be interchangeably referred to as a cell gate. For example, the stack structure ST may be understood to include at least one string selection gate (e.g., at least one of gate electrode layers WLn-1, WLn-2, WLn-3, and WLn-4, for example as shown in FIGS. 4 and 8) and a plurality of cell gates (e.g., the remaining gate electrode layers WLn-5 and WLk+1, for example as shown in FIG. 4). However, the specific number or position of the erase control line ECL and the string selection line SSL is not limited.

Referring to FIG. 4, the stack structure ST may include a first stack structure ST1 (e.g., a lower stack structure) and a second stack structure ST2 (e.g., an upper stack structure) disposed on the first stack structure ST1. The first stack structure ST1 may include the ground selection line GSL and some word lines WL0 to WLk. The second stack structure ST2 may include the remaining word lines WLk+1 to WLn, the dummy word line DWL, the string selection line SSL, and the erase control line ECL. Here, n is a natural number greater than k.

In some example embodiments, the first stack structure ST1 may be disposed on the support semiconductor layer 110. The first stack structure ST1 may include a plurality of first gate electrode layers GSL and WL0 to WLk and a plurality of first inter-electrode insulating layers 141 alternately stacked on the support semiconductor layer 110. For example, each of the plurality of first gate electrode layers GSL and WL0 to WLk and each of the first inter-electrode insulating layers 141 may have a laminar structure in which they extend in the first direction DR1 and the second direction DR2. The first gate electrode layers GSL and WL0 to WLk and the first inter-electrode insulating layer 141 may be alternately stacked in the third direction DR3 intersecting (e.g., perpendicular to) an upper surface of the substrate 100. The first gate electrode layers GSL and WL0 to WLk may include at least one string selection gate and a plurality of cell gates.

In some example embodiments, the plurality of first gate electrode layers GSL and WL0 to WLk may include the ground selection line GSL and a plurality of first word lines WL0 to WLk sequentially stacked on the substrate 100. In some example embodiments, the ground selection line GSL may be a gate electrode disposed at the lowermost portion among the plurality of first gate electrode layers GSL and WL0 to WLk.

The second stack structure ST2 may be disposed on the first stack structure ST1. The second stack structure ST2 may include a plurality of second gate electrode layers WLk+1 to WLn and a plurality of second inter-electrode insulating layers 142 alternately stacked on the first stack structure ST1. For example, each of the plurality of second gate electrode layers WLk+1 to WLn and each of the second inter-electrode insulating layers 142 may have a laminar structure in which they extend in the first direction DR1 and the second direction DR2. The plurality of second gate electrode layers WLk+1 to WLn may include at least one string selection gate and a plurality of cell gates.

The first gate electrode layers GSL and WL0 to WLk and the second gate electrode layers WLk+1 to WLn may include a conductive material. For example, the first gate electrode layers GSL and WL0 to WLk and the second gate electrode layers WLk+1 to WLn may include a metal such as tungsten (W), cobalt (Co), or nickel (Ni) or a semiconductor material such as silicon, but are not limited thereto.

In some example embodiments, it has been illustrated that the conductive lines GSL, WL0 to WLk, DWL, SSL, and MCL are formed as a single film, but this is only for convenience of explanation, and the present inventive concepts are not limited thereto.

An insulating film 146 may be disposed between the conductive lines GSL, WL0 to WLk, DWL, SSL, and MCL and an information storage pattern 152. The insulating film 146 may include, for example, silicon oxide or a high-k material (e.g., aluminum oxide ($Al_2O_3$) or hafnium oxide ($HfO_2$)). Unlike illustrated, the insulating film 146 may not be disposed between the conductive lines GSL and WL0 to WLn and the information storage pattern 152.

Referring to FIGS. 6 to 8, the conductive lines GSL and WL0 to WLn may further include a barrier conductive film 147. The barrier conductive film 147 may include at least one of a metal, metal nitride, metal carbonitride, and a two-dimensional (2D) material. For example, the two-dimensional material may be a metallic material and/or a semiconductor material. The two-dimensional material may include a two-dimensional allotrope or a two-dimensional compound.

The first inter-electrode insulating layer 141 and the second inter-electrode insulating layer 142 may include an insulating material. For example, the first inter-electrode insulating layer 141 and the second inter-electrode insulating layer 142 may include silicon oxide, but are not limited thereto.

A channel structure CH may penetrate through the first stack structure ST1 and the second stack structure ST2. In addition, a plurality of channel structures CH may extend in a direction intersecting the plurality of gate electrode layers GSL and WL0 to WLn. For example, each channel structure CH may extend in the third direction DR3.

The channel structure CH may include a lower channel structure CH_1 penetrating through the first stack structure ST1 and an upper channel structure CH_2 penetrating through the second stack structure ST2. The lower channel structure CH_1 and the upper channel structure CH_2 may be continuously connected to each other. That is, the lower channel structure CH_1 and the upper channel structure CH_2 may be a single body.

A width of a lower surface of the lower channel structure CH_1 in the first direction DR1 may be smaller than that of an upper surface of the lower channel structure CH_1 in the first direction DR1. A width of the lower channel structure CH_1 in the first direction DR1 may increase as the lower channel structure CH_1 becomes more distant from an upper surface of the substrate 100. This may be due to characteristics of an etching process for forming the lower channel structure CH_1.

A width of a lower surface of the upper channel structure CH_2 in the first direction DR1 may be smaller than that of an upper surface of the upper channel structure CH_2 in the first direction DR1. A width of the upper channel structure CH_2 in the first direction DR1 may increase as the upper channel structure CH_2 becomes more distant from the upper surface of the substrate 100. This may be due to characteristics of an etching process for forming the upper channel structure CH_2.

A width W1 of the uppermost surface of the lower channel structure CH_1 in the first direction DR1 may be greater than a width W2 of the lowermost surface of the upper channel structure CH_2 in the first direction DR1. That is, a sidewall CH s of the channel structure CH may have a step. This may be due to the fact that the etching process for forming the lower channel structure CH_1 penetrating through the first stack structure ST1 and the etching process for forming the upper channel structure CH_2 penetrating through the second stack structure ST2 are separately performed.

Each channel structure CH may include a semiconductor pattern 150 and the information storage pattern 152. As shown, the information storage pattern 152 and the semiconductor pattern 150 may sequentially extend along a profile of a channel hole penetrating through the first and second stack structures ST1 and ST2.

The semiconductor pattern 150 may penetrate the first stack structure ST1 and the second stack structure ST2. For example, the semiconductor pattern 150 may extend in the third direction DR3.

The semiconductor pattern 150 may include, for example, a semiconductor material such as single crystal silicon, polycrystalline silicon, an organic semiconductor material, and a carbon nanostructure, but is not limited thereto.

The information storage pattern 152 may be interposed between the semiconductor pattern 150 and each of the gate electrode layers GSL and WL0 to WLn. For example, the information storage pattern 152 may extend along a side surface of the semiconductor pattern 150.

The information storage pattern 152 may include, for example, at least one of silicon oxide, silicon nitride, silicon oxynitride, and a high-k material having a higher dielectric constant than the silicon oxide. The high-k material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some example embodiments, the information storage pattern 152 may include a plurality of films. For example, referring to FIG. 6, the information storage pattern 152 may include a tunnel insulating film 152a, a charge storage film 152b, and a blocking insulating film 152c sequentially stacked on the semiconductor pattern 150.

The tunnel insulating film 152a may include, for example, silicon oxide or a high-k material (e.g., aluminum oxide ($Al_2O_3$) or hafnium oxide ($HfO_2$)) having a higher dielectric constant than the silicon oxide. The charge storage film 152b may include, for example, silicon nitride. The blocking insulating film 152c may include, for example, silicon oxide or a high-k material (e.g., aluminum oxide ($Al_2O_3$) or hafnium oxide ($HfO_2$)) having a higher dielectric constant than the silicon oxide.

Referring to FIG. 6, the tunnel insulating film 152a, the charge storage film 152b, and the blocking insulating film 152c may be separated at a lower portion of the channel structure CH. The support semiconductor layer 110 may be disposed between the separated tunnel insulating films 152a, charge storage films 152b, and blocking insulating films 152c. The support semiconductor layer 110 may electrically connect the common source plate 105 and the semiconductor pattern 150 to each other.

Alternatively, referring to FIG. 7, when the support semiconductor layer 110 is not disposed, the tunnel insulating film 152a, the charge storage film 152b, and the blocking insulating film 152c may be separated at a bottom surface of the channel structure CH. That is, a sidewall of the semiconductor pattern 150 may not be exposed, and a bottom surface of the semiconductor pattern 150 may be exposed. The semiconductor pattern 150 may be electrically connected to the common source plate 105 through the exposed bottom surface of the semiconductor pattern 150.

In some example embodiments, each channel structure CH may further include a filling pattern 154. The filling pattern 154 may be formed to fill an inner portion of the semiconductor pattern 150. For example, the semiconductor pattern 150 may extend along a side surface and a bottom surface of the filling pattern 154. The filling pattern 154 may include, for example, silicon oxide, but is not limited thereto.

In some example embodiments, each channel structure CH may further include a channel pad 156. The channel pad 156 may be formed to be connected to an upper portion of the semiconductor pattern 150. For example, the channel pad 156 may be formed in a second inter-electrode insulating layer 142 disposed at the uppermost portion of the second stack structure ST2.

It has been illustrated in FIG. 4 that the channel pad 156 is formed on an upper surface of the semiconductor pattern 150, but this is only an example. For example, the upper portion of the semiconductor pattern 150 may be formed to extend along a side surface of the channel pad 156. The channel pad 156 may include, for example, polysilicon doped with impurities, but is not limited thereto.

In some example embodiments, the plurality of channel structures CH may be arranged in a zigzag shape. For example, as illustrated in FIG. 2, the plurality of channel structures CH may be arranged to be misaligned with each other in the first direction DR1 and the second direction DR2. The plurality of channel structures CH arranged in the zigzag shape may further improve a degree of integration of a nonvolatile memory device.

A first interlayer insulating film 165 and a second interlayer insulating film 173 may include, for example, silicon oxide, but are not limited thereto.

A plurality of bit lines 180 may be spaced apart from each other and extend side by side. For example, each bit line 180 may extend in the first direction DR1.

Each bit line 180 may be connected to the plurality of channel structures CH. For example, as illustrated in FIG. 4, the bit line BL may be connected to the plurality of channel structures CH through bit line contacts 177. The bit line contacts 177 may penetrate through, for example, the first interlayer insulating film 165 and the second interlayer insulating film 173 to electrically connect the bit line 180 and the channel structures CH to each other.

The first stack structure ST1 and the second stack structure ST2 may be separated by a plurality of cell separation structures WLC. As shown, the cell separation structures WLC may be understood to separate the cell unit CU in the first direction DR1 (e.g., isolate separate portions of the cell unit CU from direct contact with each other in the first direction DR1. The cell separation structure WLC may extend in a direction intersecting the bit line 180. For example, the cell separation structure WLC may extend in the third direction DR3 to completely cut the first stack structure ST1 and the second stack structure ST2.

Accordingly, the plurality of first gate electrode layers GSL and WL0 to WLk and the plurality of second gate electrode layers WLk+1 to WLn may be cut by the cell separation structure WLC. In addition, the plurality of cell separation structures WLC may be spaced apart from each other in the first direction DR1. The first stack structure ST1 and the second stack structure ST2 may form a cell unit CU included in one block BLK by first and second cell separation structures WLC_1 and WLC_2 neighboring to each other.

In some example embodiments, the gate cutting structure SC cutting the string selection line SSL may be formed in the stack structure ST of the cell unit CU. Between the first and second cell separation structures WLC_1 and WLC_2 (e.g., between adjacent cell separation structures of the plurality of cell separation structures WLC), the first stack structure ST1 and the second stack structure ST2 may be cut by a plurality of gate cutting structures SC. Within one block BLK, first and second gate cutting structures SC_1 and SC_2 may be arranged to be spaced apart from each other in the first direction DR1. The first and second gate cutting structures SC_1 and SC_2 may extend in the third direction DR3 to cut the first stack structure ST1 and/or the second stack structure ST2.

In some example embodiments, the first and second gate cutting structures SC_1 and SC_2 may be interposed between the plurality of cell separation structures WLC_1 and WLC_2 so as to define first and second regions I and II in the cell unit CU, respectively. Accordingly, the gate cutting structures (e.g., SC_1 and SC_2) may define regions within the cell unit CU between adjacent cell separation structures (e.g., WLC_1 and WLC_2). Specifically, the cell unit CU includes the first regions I between the first cell separation structure WLC_1 and the first gate cutting structure SC_1 and between the second cell separation structure WLC_2 and the second gate cutting structure SC_2. In addition, the cell unit CU includes the second region II between the first and second gate cutting structures SC_1 and SC_2. For example, the cell unit CU may include a first region I defined between the first cell separation structure WLC_1 and a first gate cutting structure SC_1 and may further include a second region defined between adjacent gate cutting structures (e.g., the first and second gate cutting structures SC_1 and SC_2).

A width of a lower surface of the cell separation structure WLC in the first direction DR1 and a width of a lower surface of the gate cutting structure SC in the first direction DR1 may be smaller than a width of an upper surface of the cell separation structure WLC in the first direction DR1 and a width of an upper surface of the gate cutting structure SC in the first direction DR1, respectively. A width of the cell separation structure WLC in the first direction DR1 and a width of the gate cutting structure SC in the first direction DR1 may increase as the cell separation structure WLC and the gate cutting structure SC become more distant from the upper surface of the substrate 100. This may be due to characteristics of an etching process for forming the cell separation structure WLC and the gate cutting structure SC.

In the second region II of the cell unit CU, a ratio of a region of the stack structure ST occupied by a conductive material may be greater in string selection gate layers WLn−1, WLn−2, WLn−3, and WLn−4 (see FIG. 8) than in the cell gate electrode layers WLn−5 and WLk+1 (see FIG. 4). The gate electrode layers GSL and WL0 to WLn are formed by removing sacrificial layers and then filling a conductive material in spaces in which the sacrificial layers are removed by a replacement process, as described below. In this case, the conductive material may not be completely filled in the spaces from which the sacrificial layers are removed, and empty spaces, that is, seams SM, may thus be formed in the gate electrode layers GSL and WL0 to WLn. As a result, there is a problem that resistance characteristics of a component are deteriorated. Such a problem may be particularly noticeable in regions of the gate electrode layers GSL and WL0 to WLn far from the cell separation structure WLC in the gate electrode layers GSL and WL0 to WLn. However, some example embodiments, the above-described seam SM may be reduced or minimized by removing the conductive material formed by the replacement process and then filling a conductive material again. In the second region II far from the cell separation structure WLC, a ratio of a region occupied by the seam SM may be smaller than in the string selection gate layers WLn−1, WLn−2, WLn−3, and WLn−4 (see FIG. 8) than in the cell gate electrode layers WLn−5 and WLk+1 (see FIG. 4). For example, in at least the second region II, a given proportion of the volume of each given string selection gate layer WLn−1, WLn−2, WLn−3, and WLn−4 (e.g., string selection gate) comprised by (e.g., occupied by) conductive material may be greater than a given proportion of the volume of each given cell gate electrode layer WLn−5 and WLk+1 (e.g., each given cell gate) comprised by (e.g., occupied by) conductive material. For example, a ratio of a region of at least one string selection gate that is occupied by a conductive material in the second region II (e.g., a proportion of a region of a given string selection gate WLn−1, WLn−2, WLn−3, and/or WLn−4 in the second region II that is occupied by the conductive material) may be greater than a ratio of a region of at least one cell gate of the plurality of cell gates that is occupied by the conductive material in the second region II (e.g., a proportion of a region of a given cell gate WLn−5 and/or WLk+1 in the second region II that is occupied by the conductive material). For example, in at least the second region II, a given proportion of the volume of each given string selection gate layer WLn−1, WLn−2, WLn−3, and WLn−4 (e.g., string selection gate) comprised by (e.g., occupied by) a seam SM (e.g., a first seam SM) in the given string selection gate layer may be smaller than a given proportion the volume of each given cell gate electrode layer WLn−5 and WLk+1 (e.g., each given cell gate) comprised by (e.g., occupied by) a seam SM (e.g., a second seam SM) in the given cell gate electrode layer. Restated, where the stack structure ST includes a seam SM (e.g., first seam SM) in at least one string selection gate (e.g., WLn−1, WLn−2, WLn−3, and/or WLn−4) and a seam SM (e.g., second seam SM) in at least one cell gate (e.g., WLn−5 and/or WLk+1) a ratio (e.g., proportion) of a region of the at least one string selection gate that is occupied by the first seam SM in the second region II is smaller than a ratio of a region of the at least one cell gate that is occupied by the second seam SM in the second region II.

As a result, even though the number of channel structures CH increases, the resistance characteristic of the component may be secured.

Referring to FIGS. 4 and 9, the seams SM (e.g., first seams SM) of the string selection gate layers WLn−1, WLn−2, WLn−3, and WLn−4 (see FIG. 8) in the second region II are spaced apart from the first and second gate cutting structures SC_1 and SC_2 in the first direction DR1. For example, where the cell unit CU includes a first region I defined between a first cell separation structure WLC_1 and a first gate cutting structure SC_1, and a second region defined between the first gate cutting structure SC_1 and a second gate cutting structure SC_2, a seam SM (e.g., first seam SM) in at least one string selection gate (e.g., WLn−1, WLn−2, WLn−3, and/or WLn−4) in the second region II may be spaced apart from (e.g., isolated from direct contact with the first gate cutting structure SC_1 in the first direction DR1.

Referring to FIGS. 4 and 10, the seams SM (e.g., respective second seams SM) of the cell gate electrode layers WLn−5 or WLk+1 (see FIG. 4) overlap the first and second gate cutting structures SC_1 and SC_2 in the third direction DR3 which intersects the first direction DR1 (e.g., is perpendicular to the first direction DR1 as shown). For example, a seam SM (e.g., second seam SM) of at least one cell gate (e.g., WLn−5 and/or WLk+i) may overlap the first gate cutting structure SC_1 in the third direction DR3.

Referring to FIG. 8, recesses R in which the string selection gate layers WLn−1, WLn−2, WLn−3, and WLn−4 (see FIG. 8) are recessed are formed between the string selection gate layers WLn−1, WLn−2, WLn−3, and WLn−4 (see FIG. 8) and the second gate cutting structure SC_2. For example, and as shown, at least one string selection gate (e.g., WLn−1, WLn−2, WLn−3, and WLn−4) may be recessed (e.g., offset) in the first direction DR1 in relation to a sidewall of a gate cutting structure (e.g., the second gate cutting structure SC_2 as shown and/or the first gate cutting structure SC_1) such that a side surface of the at least one string selection gate may at least partially define (e.g., collectively with adjacent inter-electrode insulating layers 142) a recess R that is between the at least one string selection gate and the gate cutting structure. The recesses R are filled with an insulating material.

Referring to FIG. 9, sizes (e.g., diameters in the third direction DR3) of the seams SM (e.g., first seams SM) of the string selection gate layers WLn−1, WLn−2, WLn−3, and WLn−4 (see FIG. 8) in the first region I decrease as the string selection gate layers become more adjacent to the first gate cutting structure SC_1. For example, as shown in at least FIG. 9, a size (e.g., diameter in the third direction DR3) of a first seam SM of a given string selection gate (e.g., WLn−1, WLn−2, WLn−3, and/or WLn−4) in the first region I may decrease with increasing proximity of the first seam SM to the first gate cutting structure SC_1 in the first, second, and/or third directions DR1, DR2, and/or DR3 (e.g., the magnitude of the diameter and/or area of a given cross-section in the second and third directions DR2 and DR3 of the first seam SM may be at least partially inversely proportional to proximity of the given cross-section of the first seam SM to the first gate cutting structure SC_1 in the first, second, and/or third directions DR1, DR2, and/or DR3). Although not specifically illustrated, sizes of the seams SM of the string selection gate layers WLn−1, WLn−2, WLn−3, and WLn−4 (see FIG. 8) in the second region II decrease as the string selection gate layers become more adjacent to the second gate cutting structure SC_2.

Referring to FIG. 10, sizes of the seams SM of the cell gate electrode layers WLn−5 or WLk+1 (see FIG. 4) in the first region I increase as the cell gate electrode layers become more adjacent to the first gate cutting structure SC_1. For example, as shown in at least FIG. 10, a size (e.g., diameter in the third direction DR3) of a second seam SM of a given cell gate (e.g., WLn−5 and/or WLk+1) in the first region I may increase with increasing proximity of the second seam SM to the first gate cutting structure SC_1 in the first, second, and/or third directions DR1, DR2, and/or DR3 (e.g., the magnitude of the diameter and/or area of a given cross-section in the second and third directions DR2 and DR3 of the second seam SM may be at least partially inversely proportional to proximity of the given cross-section of the second seam SM to the first gate cutting structure SC_1 in the first, second, and/or third directions DR1, DR2, and/or DR3). Although not specifically illustrated, sizes of the seams SM of the cell gate electrode layers WLn−5 or WLk+1 (see FIG. 4) in the second region II increase as the cell gate electrode layers become more adjacent to the second gate cutting structure SC_2.

Referring to FIG. 9, the seams SM of the string selection gate layers WLn−1, WLn−2, WLn−3, and WLn−4 (see FIG. 8) in the first region I are not exposed to one side surfaces of the string selection gate layers WLn−1, WLn−2, WLn−3, and WLn−4 (see FIG. 8) adjacent to the first cell separation structure WLC_1. For example, as shown in FIG. 9, a first seam SM of a given string selection gate (WLn−1, WLn−2, WLn−3, and/or WLn−4) in the first region I may be isolated from (e.g., obscured from exposure to) a side surface of the given string selection gate that is adjacent to (e.g., is the proximate side surface to) the first cell separation structure WLC_1 (e.g., isolated from the side surface by conductive material of the given string selection gate).

Figure 11:
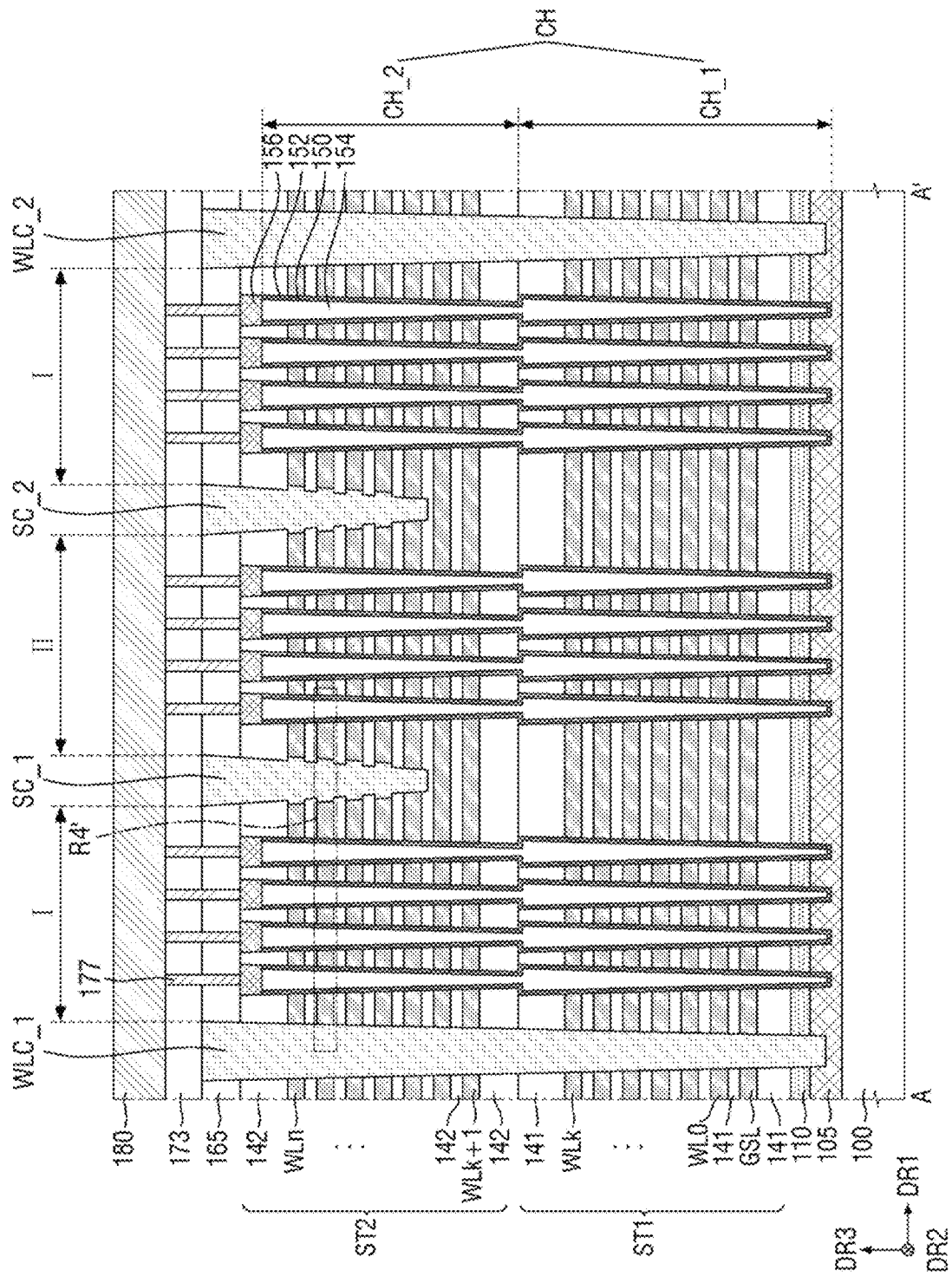
FIG. 11 is a view for describing a semiconductor memory device according to some example embodiments, and is a view corresponding to the cross-sectional view taken along line A-A' of FIG. 2.
Figure 12:
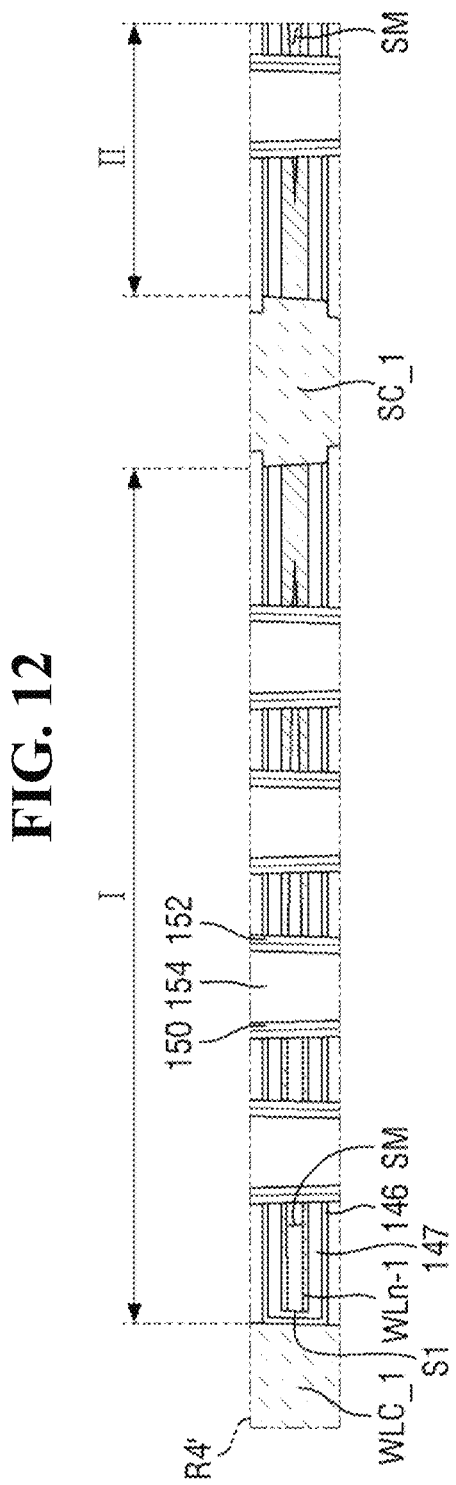
FIG. 12 is an enlarged view of R4' of FIG. 11.

FIG. 11 is a view for describing a semiconductor memory device according to some example embodiments, and is a view corresponding to the cross-sectional view taken along line A-A' of FIG. 2. FIG. 12 is an enlarged view of R4' of FIG. 11. For convenience of explanation, portions overlapping those described above with reference to FIGS. 2 to 10 will be briefly described or a description therefor will be omitted.

Referring to FIG. 12, the seams SM of the string selection gate layers WLn−1, WLn−2, WLn−3, and WLn−4 (see FIG. 8) in the first region I are exposed to one side surfaces S1 of the string selection gate layers WLn−1, WLn−2, WLn−3, and WLn−4 (see FIG. 8) adjacent to the first cell separation structure WLC_1. For example, as shown in FIG. 12, a first seam SM of a given string selection gate (WLn−1, WLn−2, WLn−3, and/or WLn−4) in the first region I may be exposed to a side surface S1 of the given string selection gate that is adjacent to (e.g., is the proximate side surface to) the first cell separation structure WLC_1.

That is, a ratio of a region occupied by the seam SM in one string selection gate layer WLn−1, WLn−2, WLn−3, or WLn−4 (see FIG. 8) may be decreased by removing all of the string selection gate layers WLn−1, WLn−2, WLn−3, and WLn−4 (see FIG. 8) of the gate electrode layers GSL and WL0 to WLn and filling the conductive material again.

Figure 13:
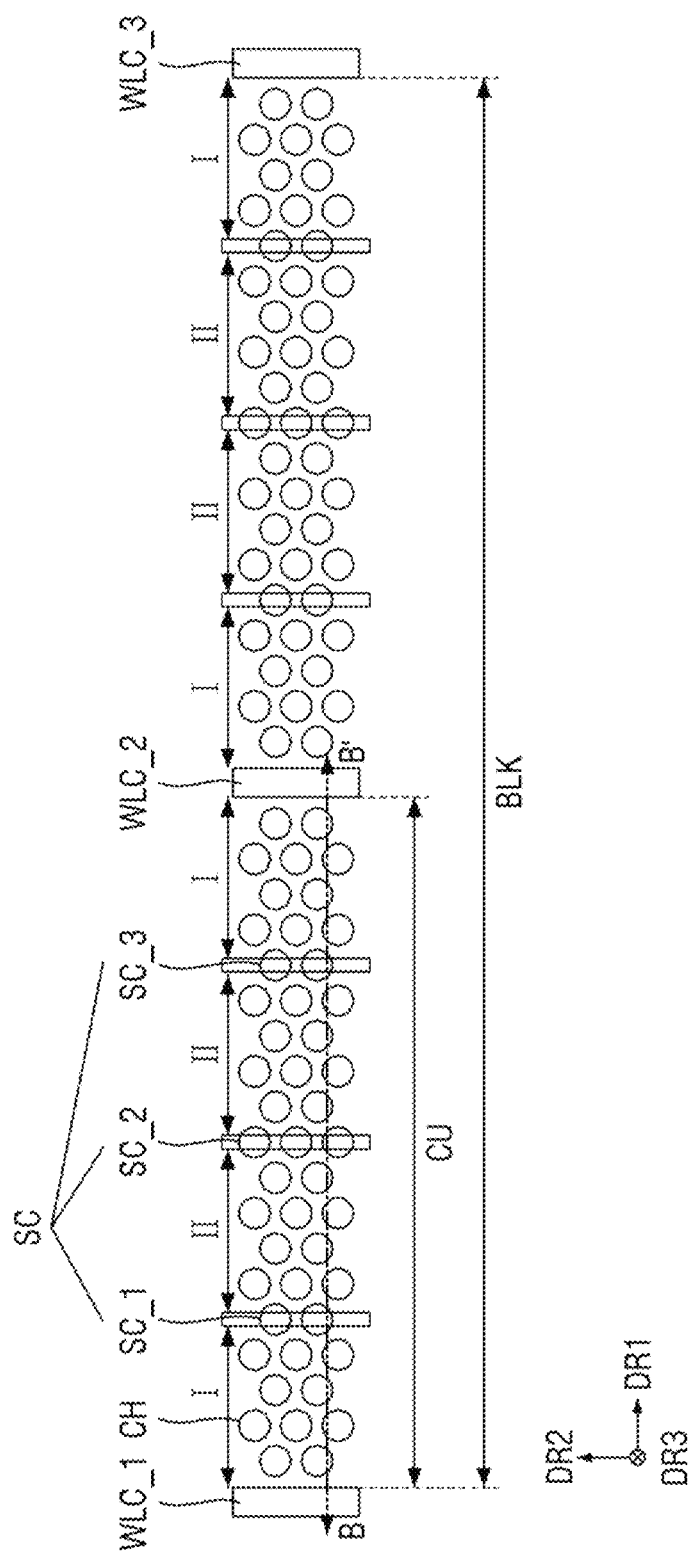
FIG. 13 is a schematic layout diagram for describing a semiconductor memory device according to some example embodiments.
Figure 14:
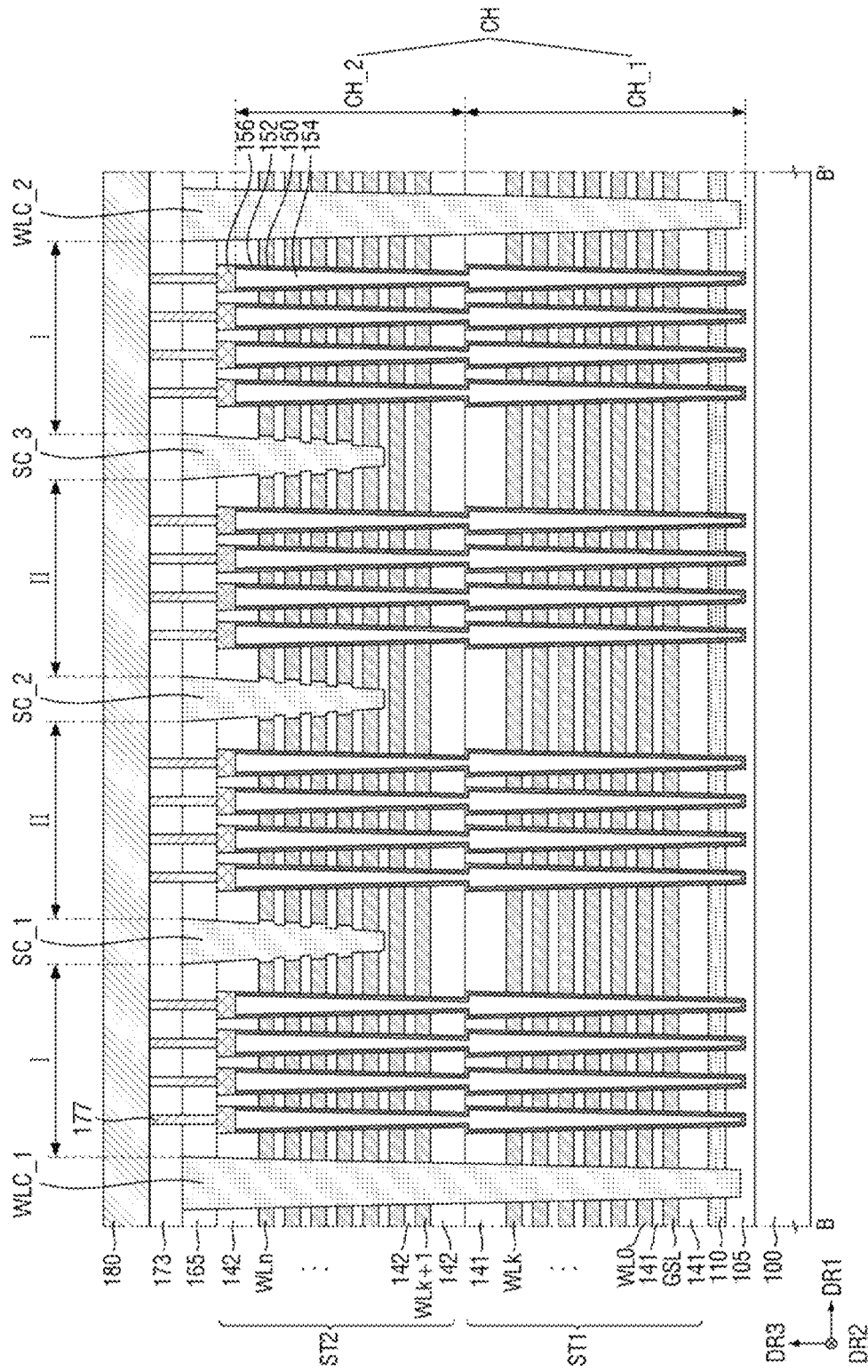
FIG. 14 is a schematic cross-sectional view taken along line B-B' of FIG. 13.

FIG. 13 is a schematic layout diagram for describing a semiconductor memory device according to some example embodiments. FIG. 14 is a schematic cross-sectional view taken along line B-B' of FIG. 13. For convenience of explanation, portions overlapping those described above with reference to FIGS. 2 to 10 will be briefly described or a description therefor will be omitted.

Referring to FIG. 13, the number of channel structures CH within one block BLK may increase.

As a degree of integration of the semiconductor memory device increases, a stack structure ST in one block BLK may be cut again by gate cutting structures SC in order to individually control a large number of channel structures CH within one block BLK.

Accordingly, within one block BLK, first to third gate cutting structures SC_1, SC_2, and SC_3 may be arranged to be spaced apart from each other in the first direction DR1. The first to third gate cutting structures SC_1, SC_2, and SC_3 may extend in the third direction DR3 to cut a first stack structure ST1 and/or a second stack structure ST2.

The first to third gate cutting structures SC_1, SC_2, and SC_3 may be interposed between the plurality of cell separation structures WLC_1 and WLC_2 so as to define first and second regions I and II in the cell unit CU, respectively. Specifically, the cell unit CU includes the first regions I between the first cell separation structure WLC_1 and the first gate cutting structure SC_1 and between the second cell separation structure WLC_2 and the third gate cutting structure SC_3. In addition, the cell unit CU includes the second regions II between the first and second gate cutting structures SC_1 and SC_2 and between the second and third gate cutting structures SC_2 and SC_3.

It will be understood that, while example embodiments may be described with reference to FIGS. 4-14 with regard to features relating to one or more string selection gate(s) and one or more cell gate(s) of the second stack structure ST2, in some example embodiments the aspects described with regard to one or more string selection gate(s) and one or more cell gate(s) of the second stack structure ST2 may apply additionally or alternatively to one or more string selection gate(s) and one or more cell gate(s) of the first stack structure ST1.

Figure 15:
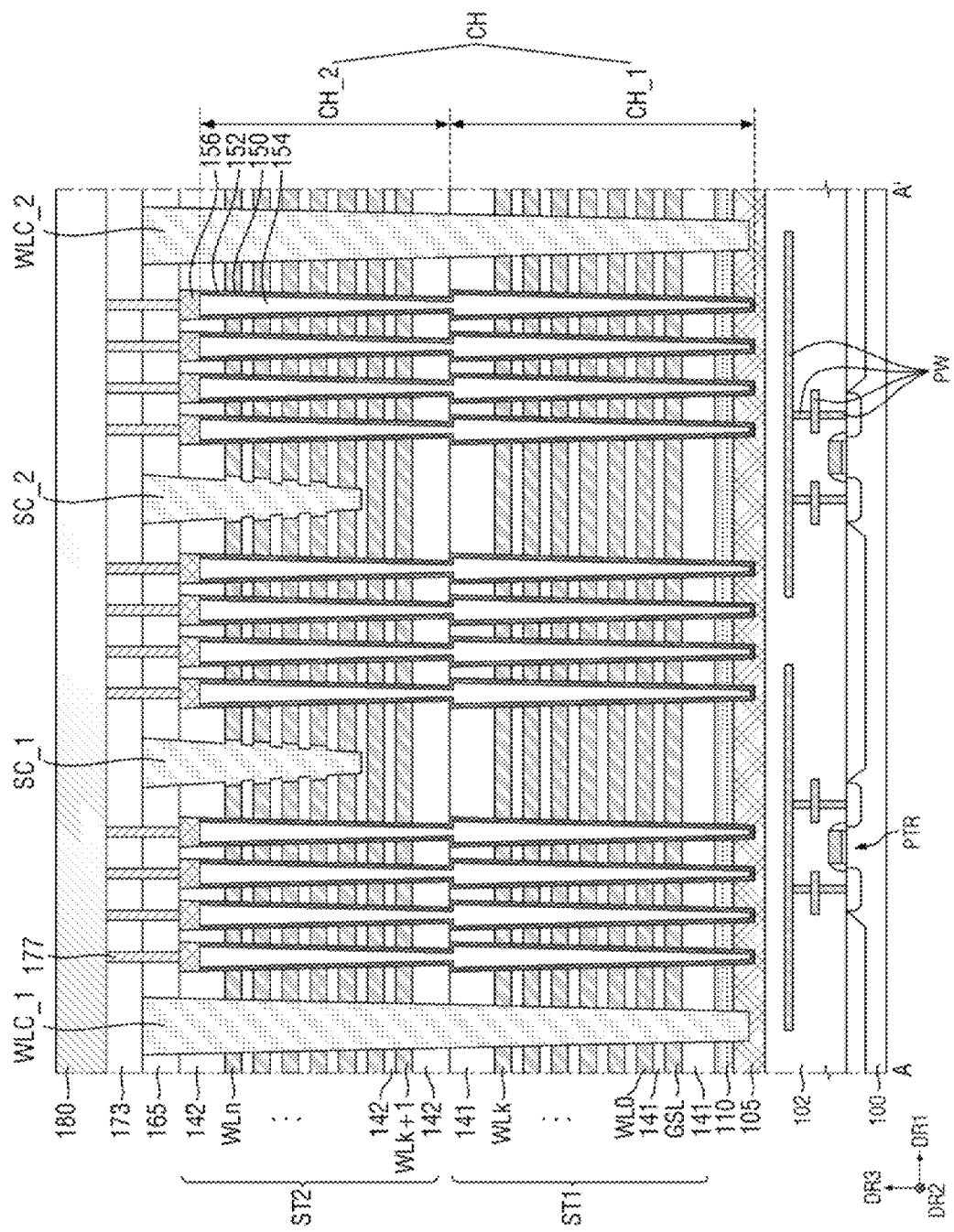
FIG. 15 is a view for describing a semiconductor memory device according to some example embodiments.

FIG. 15 is a view for describing a semiconductor memory device according to some example embodiments. FIG. 15 is a view corresponding to the cross-sectional view taken along line A-A' of FIG. 2. For convenience of explanation, portions overlapping those described above with reference to FIGS. 2 to 10 will be briefly described or a description therefor will be omitted.

Referring to FIG. 15, a semiconductor memory device according to some example embodiments may include a peripheral circuit structure PS and a cell array structure CS.

The peripheral circuit structure PS may include a peripheral circuit element PTR, a lower connection wiring body PW, and a peripheral logic insulating film 102.

The peripheral circuit element PTR may be formed on a substrate 100. The peripheral circuit element PTR may be circuits operating the cell array structure CS.

The peripheral logic insulating film 102 may be formed on the substrate 100. The peripheral logic insulating film 102 may include, for example, at least one of silicon oxide, silicon nitride, silicon oxynitride, and a low-k material.

The lower connection wiring body PW may be formed in the peripheral logic insulating film 102. The lower connection wiring body PW may be connected to the peripheral circuit element PTR.

The cell array structure CS may be disposed on the peripheral circuit structure PS. The cell array structure CS may include the substrate 100, a common source plate 105, a support semiconductor layer 110, a first stack structure ST1, a second stack structure ST2, a channel structure CH, and a bit line 180. The common source plate 105 may extend along an upper surface of the peripheral circuit structure PS.

Figure 16:
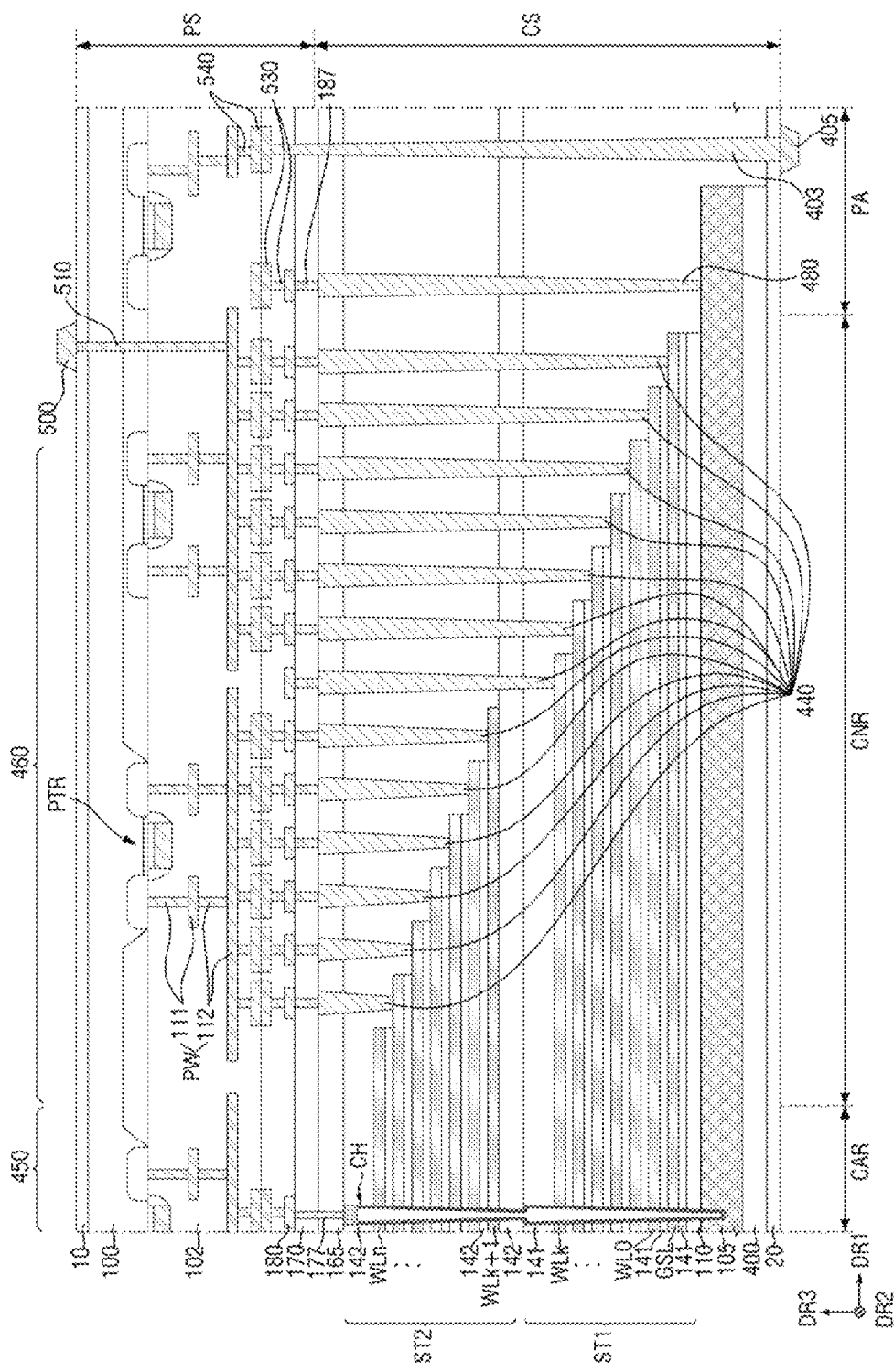
FIG. 16 is a view for describing a semiconductor memory device according to some example embodiments.

FIG. 16 is a view for describing a semiconductor memory device according to some example embodiments. For convenience of explanation, portions overlapping those described above with reference to FIGS. 2 to 10 will be briefly described or a description therefor will be omitted.

Referring to FIG. 16, the semiconductor memory device may have a chip to chip (C2C) structure. The C2C structure may refer to a structure in which an upper chip including a cell array structure CS is fabricated on a first wafer, a lower chip including a peripheral circuit structure PS is fabricated on a second wafer different from the first wafer, and the upper chip and the lower chip are then connected to each other by a bonding method. For example, the bonding method may refer to a method of electrically connecting a bonding metal formed in the uppermost metal layer of the upper chip and a bonding metal formed in the uppermost metal layer of the lower chip to each other. For example, when the bonding metal is formed of copper (Cu), the bonding method may be a Cu—Cu bonding method, and the bonding metal may also be formed of aluminum or tungsten.

Each of the peripheral circuit structure PS and the cell array structure CS of the semiconductor memory device may include an external pad bonding region PA, a cell extension region CNR, and a cell region CAR.

The peripheral circuit structure PS may include a first substrate 100, a peripheral logic insulating film 102, a plurality of circuit elements PTR formed on the first substrate 100, and a lower connection wiring body PW connected to each of the plurality of circuit elements PTR. In some example embodiments, a first metal layer 111 may be formed of tungsten having a relatively high resistance, and a second metal layer 112 may be formed of copper having a relatively low resistance.

Only the first metal layer 111 and the second metal layer 112 are illustrated and described in the present specification, but the present inventive concepts are not limited thereto, and one or more metal layers may be further formed on the second metal layer 112. At least some of the one or more metal layers formed on the second metal layer 112 may be formed of aluminum or the like having a different resistance to copper forming the second metal layer 112.

The peripheral logic insulating film 102 may be disposed on the first substrate 100 so as to cover the plurality of circuit elements PTR, the first metal layer 111, and the second metal layer 112, and include an insulating material such as silicon oxide or silicon nitride.

A lower bonding metal 540 may be formed on the second metal layer 112 of the cell region CAR. In the cell region CAR, the lower bonding metal 540 of the peripheral circuit structure PS may be electrically connected to an upper bonding metal 530 of the cell array structure CS by a bonding method, and the lower bonding metal 540 and the upper bonding metal 530 may be formed of aluminum, copper, tungsten, or the like.

The cell array structure CS may provide at least one memory block. The cell array structure CS may include a second substrate 400 and a common source plate 105. A plurality of gate electrode layers GSL, WL0 to WLk, and WLk+1 to WLn may be stacked on the second substrate 400 in a direction (third direction) perpendicular to an upper surface of the second substrate 400. String selection lines and a ground selection line may be disposed on and beneath the plurality of gate electrode layers GSL, WL0 to WLk, and WLk+1 to WLn, respectively, and the plurality of gate electrode layers GSL, WL0 to WLk, and WLk+1 to WLn may be disposed between the string selection lines and the ground selection line.

In the cell region CAR, a channel structure CH may extend in the direction perpendicular to the upper surface of the second substrate 400 and penetrate through the gate electrode layers GSL, WL0 to WLk, WLk+1 to WLn, the string selection lines, and the ground selection line. The channel structure CH may include a data storage layer, a channel layer, and a buried insulating layer, and the channel layer may be electrically connected to a first metal layer and a second metal layer. For example, the first metal layer may be a bit line contact 177, and the second metal layer may be a bit line 180. In some example embodiments, a bit line 180 may extend in the first direction DR1 parallel to the upper surface of the second substrate 400.

In some example embodiments, including the example embodiments illustrated in FIG. 16, a region in which the channel structure CH, the bit line 180 and the like are disposed may be defined as the cell region CAR. The bit line 180 may be electrically connected to circuit elements PTR providing a page buffer 450 in the peripheral circuit structure PS in the cell region CAR. As an example, the bit line 180 may be connected to upper bonding metals 530 in the peripheral circuit structure PS, and the upper bonding metals 530 may be connected to lower bonding metals 540 connected to the circuit elements PTR of the page buffer 450.

In the cell region CAR, the gate electrode layers GSL, WL0 to WLk, and WLk+1 to WLn may extend in the first direction DR1 parallel to the upper surface of the second substrate 400, and may be connected to a plurality of cell contact plugs 440. The gate electrode layers GSL, WL0 to WLk, and WLk+1 to WLn and the cell contact plugs 440 may be connected to each other at pads provided by extending at least some of the gate electrode layers GSL, WL0 to WLk, and WLk+1 to WLn at different lengths in the third direction (DR3). The first metal layer and the second metal layer may be sequentially connected to upper portions of the cell contact plugs 440 connected to the gate electrode layers GSL, WL0 to WLk, and WLk+1 to WLn. The cell contact plugs 440 may be connected to the peripheral circuit structure PS through the upper bonding metals 530 of the cell array structure CS and the lower bonding metals 540 of the peripheral circuit structure PS.

The cell contact plugs 440 may be electrically connected to circuit elements PTR providing a row decoder 460 in the peripheral circuit structure PS. In some example embodiments, an operating voltage of the circuit elements PTR providing the row decoder 460 may be different from an operating voltage of the circuit elements PTR providing the page buffer 450. For example, the operating voltage of the circuit elements PTR providing the page buffer 450 may be greater than the operating voltage of the circuit elements PTR providing the row decoder 460.

A common source line contact plug 480 may be disposed in the external pad bonding region PA. The common source line contact plug 480 may be formed of a conductive material such as a metal, a metal compound, or polysilicon, and may be electrically connected to the common source plate 105. A metal layer 187 may be disposed on the common source line contact plug 480. As an example, a region in which the common source line contact plug 480 and the metal layer 187 are disposed may be defined as the external pad bonding region PA.

Meanwhile, input/output pads 405 and 500 may be disposed in the external pad bonding region PA. Referring to FIG. 16, a lower insulating film 10 covering a lower surface of the first substrate 100 may be formed beneath the first substrate 100, and a first input/output pad 500 may be formed on the lower insulating film 10. The first input/output pad 500 may be connected to at least one of the plurality of circuit elements PTR disposed in the peripheral circuit structure PS through a first input/output contact plug 510, and be separated from the first substrate 100 by the lower insulating film 10. In addition, a side insulating film may be disposed between the first input/output contact plug 510 and the first substrate 100 to electrically separate the first input/output contact plug 510 from the first substrate 100.

Referring to FIG. 16, an upper insulating film 20 covering an upper surface of the second substrate 400 may be formed on the second substrate 400, and a second input/output pad 405 may be disposed on the upper insulating film 20. The second input/output pad 405 may be connected to at least one of the plurality of circuit elements PTR disposed in the peripheral circuit structure PS through a second input/output contact plug 403.

According to some example embodiments, the second substrate 400 and the common source plate 105 may not be disposed in a region where the second input/output contact plug 403 is disposed. In addition, the second input/output pad 405 may not overlap the gate electrode layers GSL, WL0 to WLk, and WLk+1 to WLn in the third direction DR3. Referring to FIG. 16, the second input/output contact plug 403 may be separated from the second substrate 400 in a direction parallel to the upper surface of the second substrate 400, and penetrate through the upper insulating film 20 of the cell array structure CS to be connected to the second input/output pad 405.

According to some example embodiments, the first input/output pad 500 and the second input/output pad 405 may be optionally formed. As an example, the semiconductor memory device may include only the first input/output pad 500 disposed on the first substrate 100 or include only the second input/output pad 405 disposed on the second substrate 400. Alternatively, the semiconductor memory device may include both the first input/output pad 500 and the second input/output pad 405.

In each of the external pad bonding region PA and the cell region CAR included in each of the cell array structure CS and the peripheral circuit structure PS, a metal pattern of the uppermost metal layer may exist as a dummy pattern or the uppermost metal layer may be empty.

In the semiconductor memory device, in the external pad bonding region PA, a lower bonding metal 540 having the same shape as the upper bonding metal 530 of the cell array structure CS may be formed on the uppermost metal layer of the peripheral circuit structure PS so as to correspond to the upper bonding metal 530 formed on the uppermost metal layer of the cell array structure CS. The lower bonding metal 540 formed on the uppermost metal layer of the peripheral circuit structure PS may not be connected to a separate contact in the peripheral circuit structure PS. Similarly, in the external pad bonding region PA, an upper metal pattern having the same shape as the lower bonding metal of the peripheral circuit structure PS may be formed on the uppermost metal layer of the cell array structure CS so as to correspond to the lower bonding metal formed on the uppermost metal layer of the peripheral circuit structure PS.

The lower bonding metal 540 may be formed on the second metal layer 112 of the cell region CAR. In the cell region CAR, the lower bonding metal 540 of the peripheral circuit structure PS may be electrically connected to the upper bonding metal 530 of the cell array structure CS by a bonding method.

In addition, in the cell region CAR, an upper bonding metal 530 having the same shape as the lower bonding metal 540 of the peripheral circuit structure PS may be formed on the uppermost metal layer of the cell array structure CS so as to correspond to the lower bonding metal 540 formed on the uppermost metal layer of the peripheral circuit structure PS. A contact may not be formed on the upper bonding metal 530 formed on the uppermost metal layer of the cell array structure CS.

FIGS. 17, 18, 19, 20, 21, 22, 23, 24, and 25 are intermediate step drawings for describing a method of fabricating a semiconductor memory device according to some example embodiments. For convenience of explanation, portions overlapping those described above with reference to FIGS. 2 to 10 will be briefly described or a description therefor will be omitted.

Figure 17:
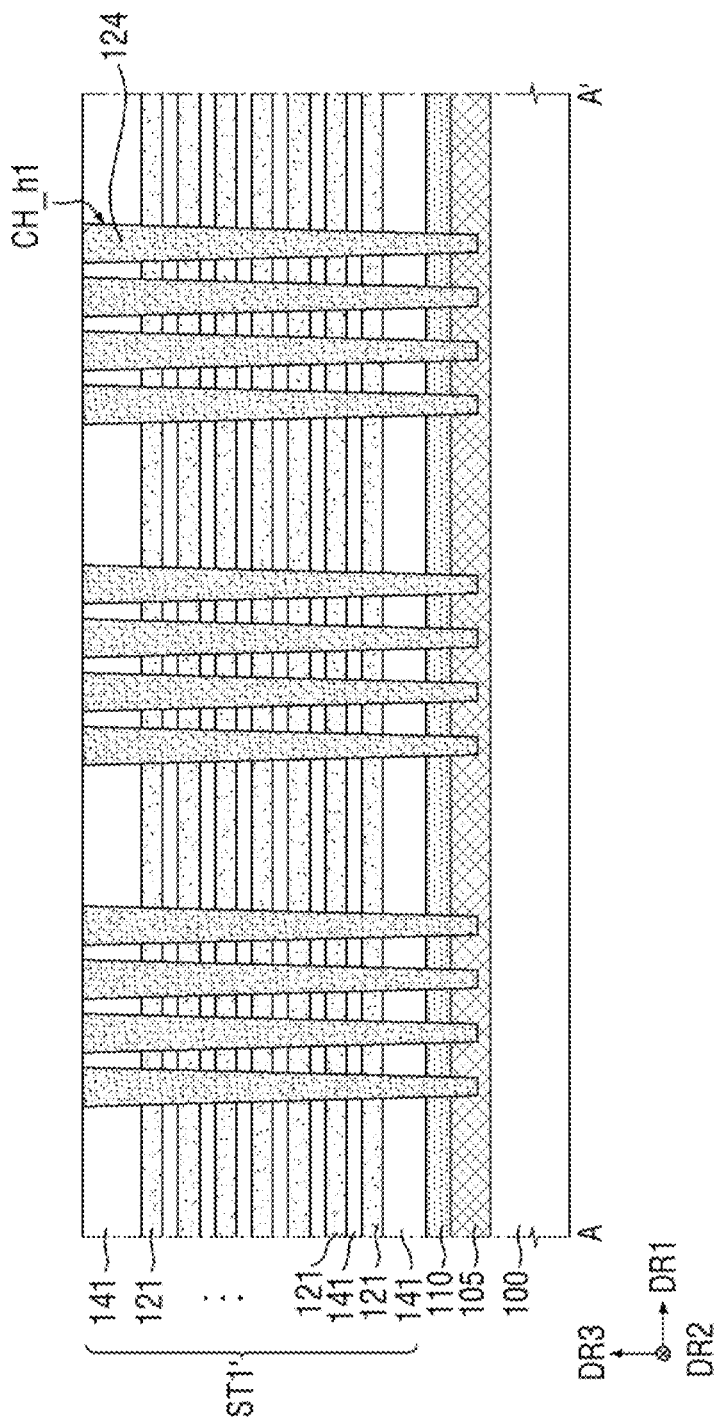
FIGS. 17, 18, 19, 20, 21, 22, 23, 24, and 25 are intermediate step drawings for describing a method of fabricating a semiconductor memory device according to some example embodiments.

Referring to FIG. 17, the common source plate 105 and the support semiconductor layer 110 may be formed on the substrate 100. A first preliminary stack structure ST1' extending in the first direction DR1 and including first inter-electrode insulating layers 141 and first sacrificial layers 121 that are sequentially stacked (e.g., alternatively stacked) may be formed on the common source plate 105 and thus may be formed on the substrate 100. The first sacrificial layer 121 may include a material having an etch selectivity with the first inter-electrode insulating layer 141. For example, when the first inter-electrode insulating layer 141 includes silicon oxide, the first sacrificial layer 121 may include polysilicon.

Subsequently, first channel holes CH_h1 penetrating through the first preliminary stack structure ST1' in the third direction DR3 (which intersects and/or is perpendicular to the first direction DR1) may be formed. Channel sacrificial patterns 124 may be formed in the first channel holes CH_h1 The channel sacrificial pattern 124 may include, for example, polysilicon, silicon oxide, silicon nitride, silicon oxynitride, or combinations thereof.

Figure 18:
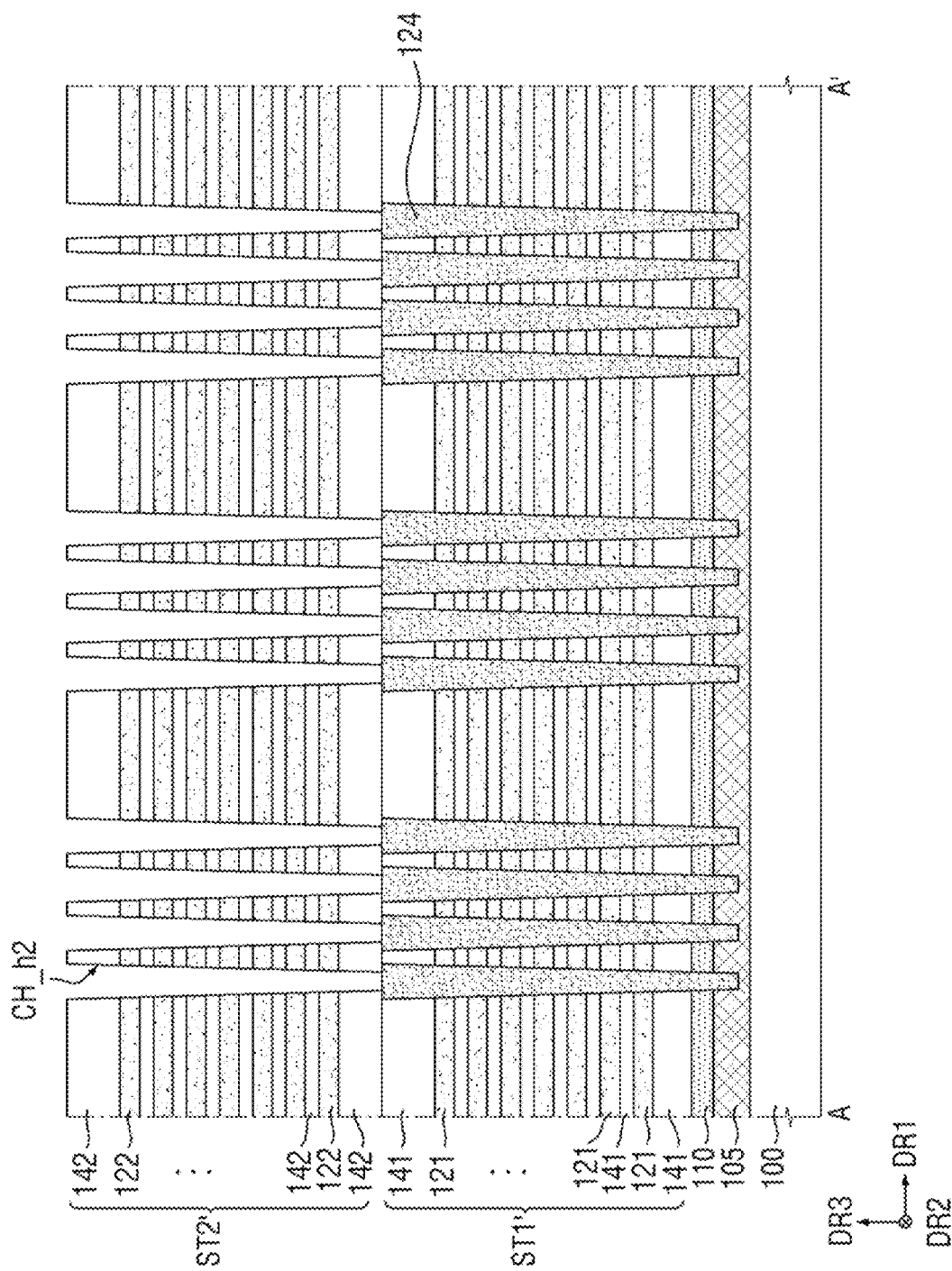

Referring to FIG. 18, a second preliminary stack structure ST2' including second inter-electrode insulating layers 142 and second sacrificial layers 122 that are sequentially stacked (e.g., alternately stacked) may be formed on the first preliminary stack structure ST1'. The second sacrificial layer 122 may include a material having an etch selectivity with the second inter-electrode insulating layer 142. For example, when the second inter-electrode insulating layer 142 includes silicon oxide, the second sacrificial layer 122 may include polysilicon.

For example, the second sacrificial layer 122 may include the same material as the first sacrificial layer 121, and the second inter-electrode insulating layer 142 may include the same material as the first inter-electrode insulating layer 141.

Thereafter, second channel holes CH_h2 penetrating through the second preliminary stack structure ST2' in the third direction DR3 and exposing at least portions of the channel sacrificial patterns 124 may be formed. Subsequently, the channel sacrificial patterns 124 may be removed through the second channel holes CH_h2. Accordingly, channel structures CH may be formed along profiles of the first channel holes CH_h1 (see FIG. 17) and the second channel holes CH_h2.

Figure 19:
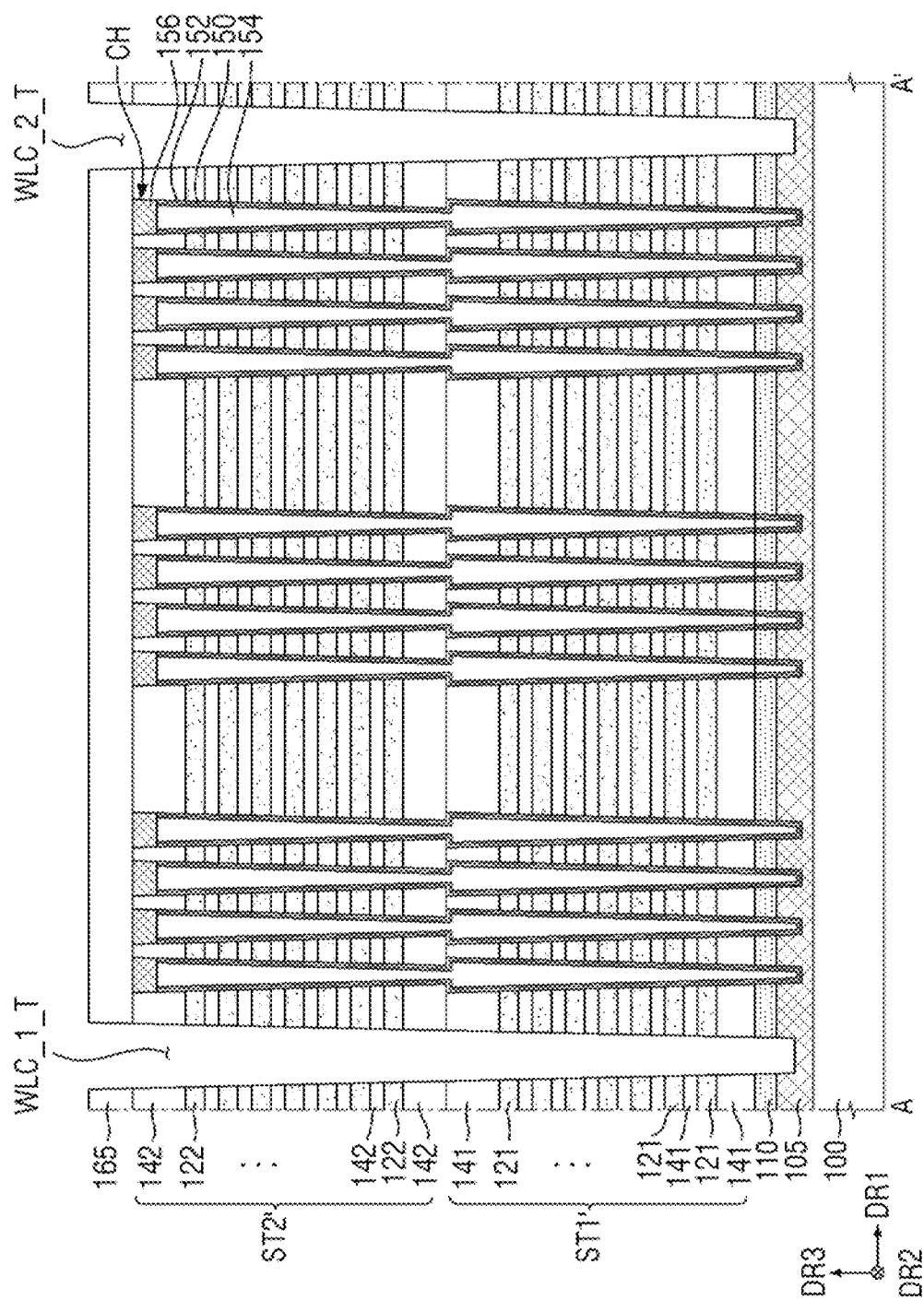

Referring to FIG. 19, a first interlayer insulating film 165 may be formed on the second preliminary stack structure ST2'.

Subsequently, a first cell separation structure trench WLC_1_T and a second cell separation structure trench WLC_2_T may be formed.

The first cell separation structure trench WLC_1_T may penetrate through the first interlayer insulating film 165, the second preliminary stack structure ST2', and the first preliminary stack structure ST1'. The first cell separation structure trench WLC_1_T may extend into, for example, a portion of the support semiconductor layer 110 in the third direction DR3.

The second cell separation structure trench WLC_2_T may penetrate through the first interlayer insulating film 165, the second preliminary stack structure ST2', and the first preliminary stack structure ST1'. The second cell separation structure trench WLC_2_T may extend into, for example, a portion of the support semiconductor layer 110 in the third direction DR3. The first cell separation structure trench WLC_1_T and the second cell separation structure trench WLC_2_T are formed to be spaced apart from each other in the first direction DR1 and will be understood to penetrate through both the first and second preliminary stack structures ST1' and ST2' and may separate a cell unit CU in the first direction DR1.

Figure 20:
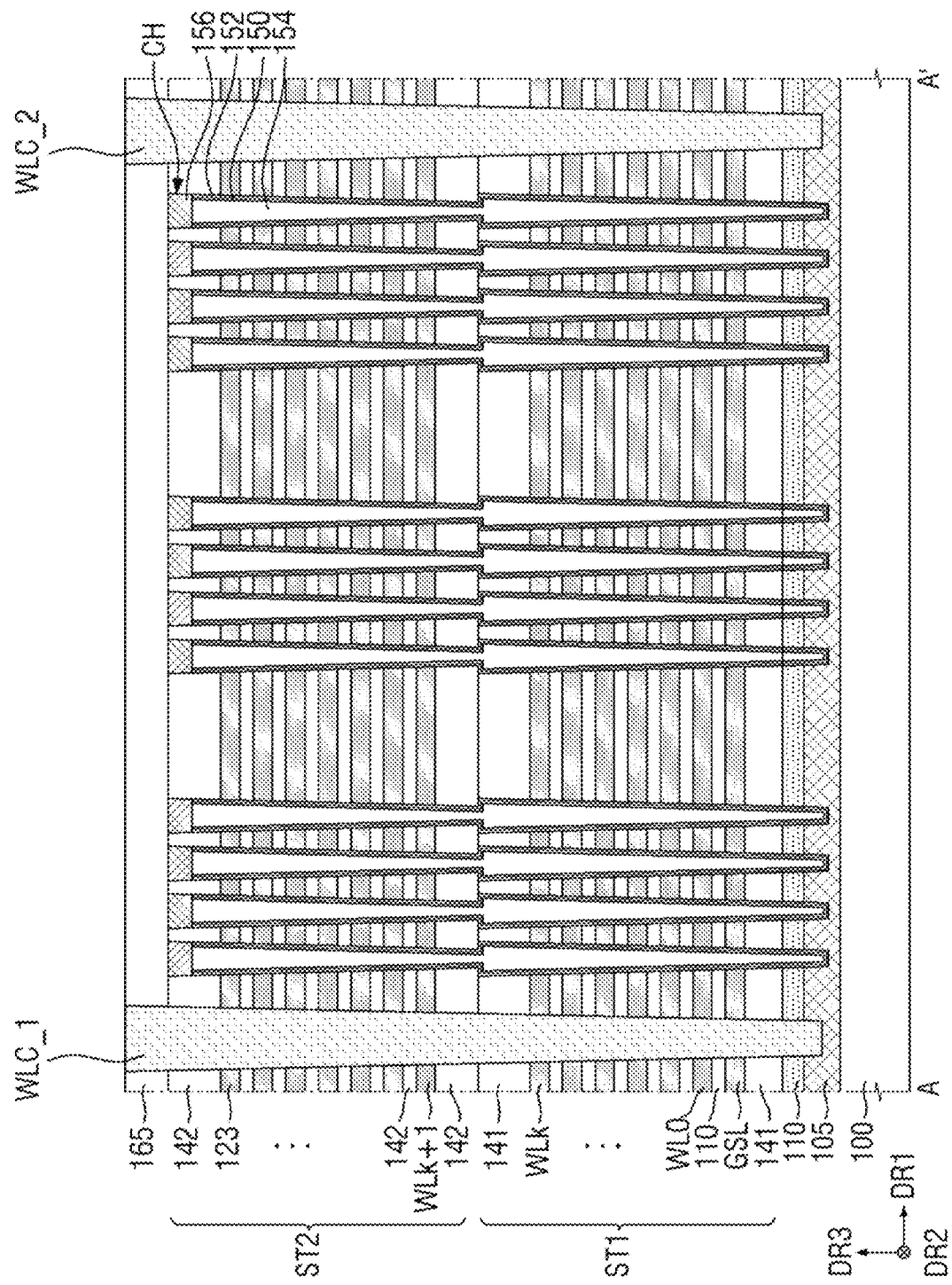

Referring to FIG. 20, an insulating material may be formed in the first cell separation structure trench WLC_1_T and the second cell separation structure trench WLC_2_T, so as to form a plurality of cell separation structures WLC (e.g., WLC_1 and WLC_2) penetrating through both the first and second preliminary stack structures ST1' and ST2' and may separate a cell unit CU in the first direction DR1. A type of the insulating material is not limited, but may include, for example, oxide.

As shown in FIG. 20, the first and second sacrificial layers 121 and 122 may be removed to form first gate electrode layers GSL and WL0 to WLk and the second preliminary gate electrode layers 123, respectively. Such an operation may occur at least partially concurrently with forming the plurality of cell separation structures WLC (e.g., WLC_1 and WLC_2). In some example embodiments, while the first sacrificial layers 121 and the second sacrificial layers 122 are removed, portions of the semiconductor patterns 150 of the channel structures CH are removed, such that the information storage patterns 152 may be exposed. In some example embodiments, after the first sacrificial layer 121 and the second sacrificial layer 122 are removed, portions of the semiconductor patterns 150 of lower portions of the channel structures CH are removed, such that the information storage patterns 152 may be exposed.

First gate electrode layers GSL and WL0 to WLk and second preliminary gate electrode layers 123 may be formed, respectively, in spaces in which the first sacrificial layers 121 and the second sacrificial layers 122 are removed.

That is, the first sacrificial layers 121 and the second sacrificial layers 122 may be replaced with the first gate electrode layers GSL and WL0 to WLk and the second preliminary gate electrode layers 123, respectively, through a replacement metal gate process. Accordingly, the first stack structure ST1 and the second stack structure ST2 may be formed.

Figure 25:
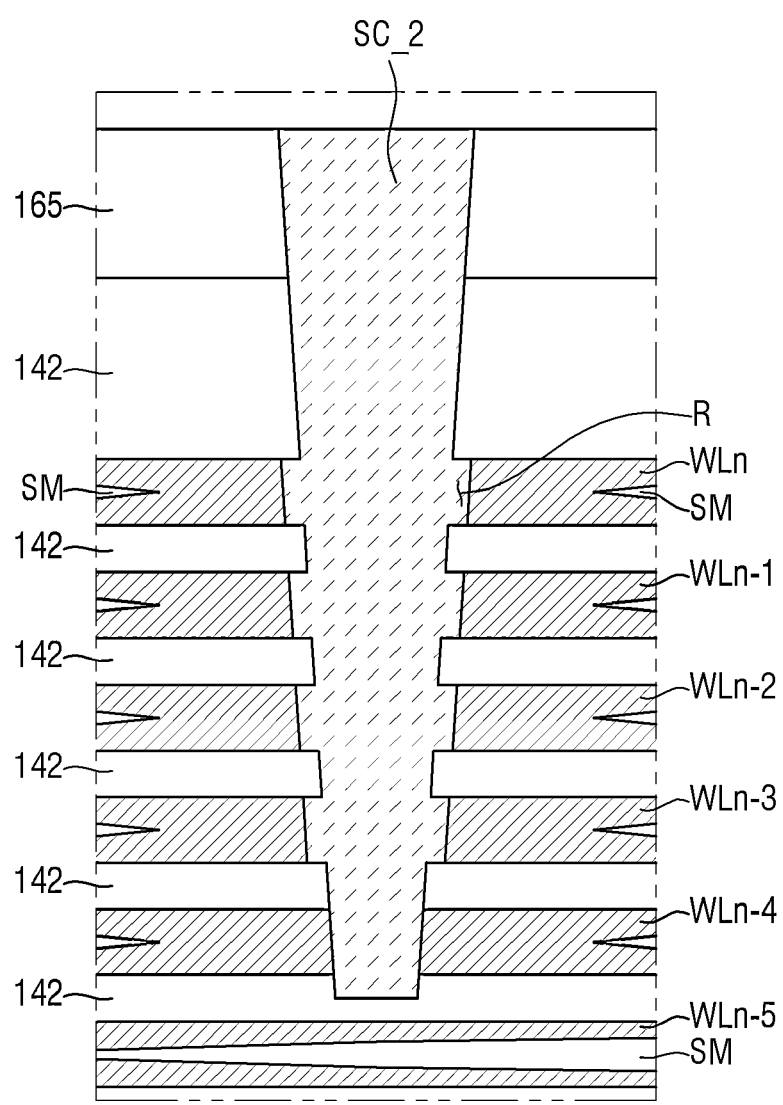

Subsequently, referring to FIG. 21, a first gate cutting structure trench SC_1_T and a second gate cutting structure trench SC_2_T are formed to penetrate through at least portions of the second stack structure ST2. Accordingly, the first gate cutting structure trench SC_1_T and the second gate cutting structure trench SC_2_T may cut at least portions of the second preliminary gate electrode layer 123. As shown in FIGS. 4 and 25, the first gate cutting structure trench SC_1_T and the second gate cutting structure trench SC_2_T may be at least partially filled (e.g., with insulating material, such as silicon oxide) to form a plurality of gate cutting structures (e.g., SC_1 and SC_2) cutting the second preliminary gate electrode layers 123 to define regions within the cell unit CU between the plurality of cell separation structures WLC (e.g., WLC_1 and WLC_2).

Figure 21:
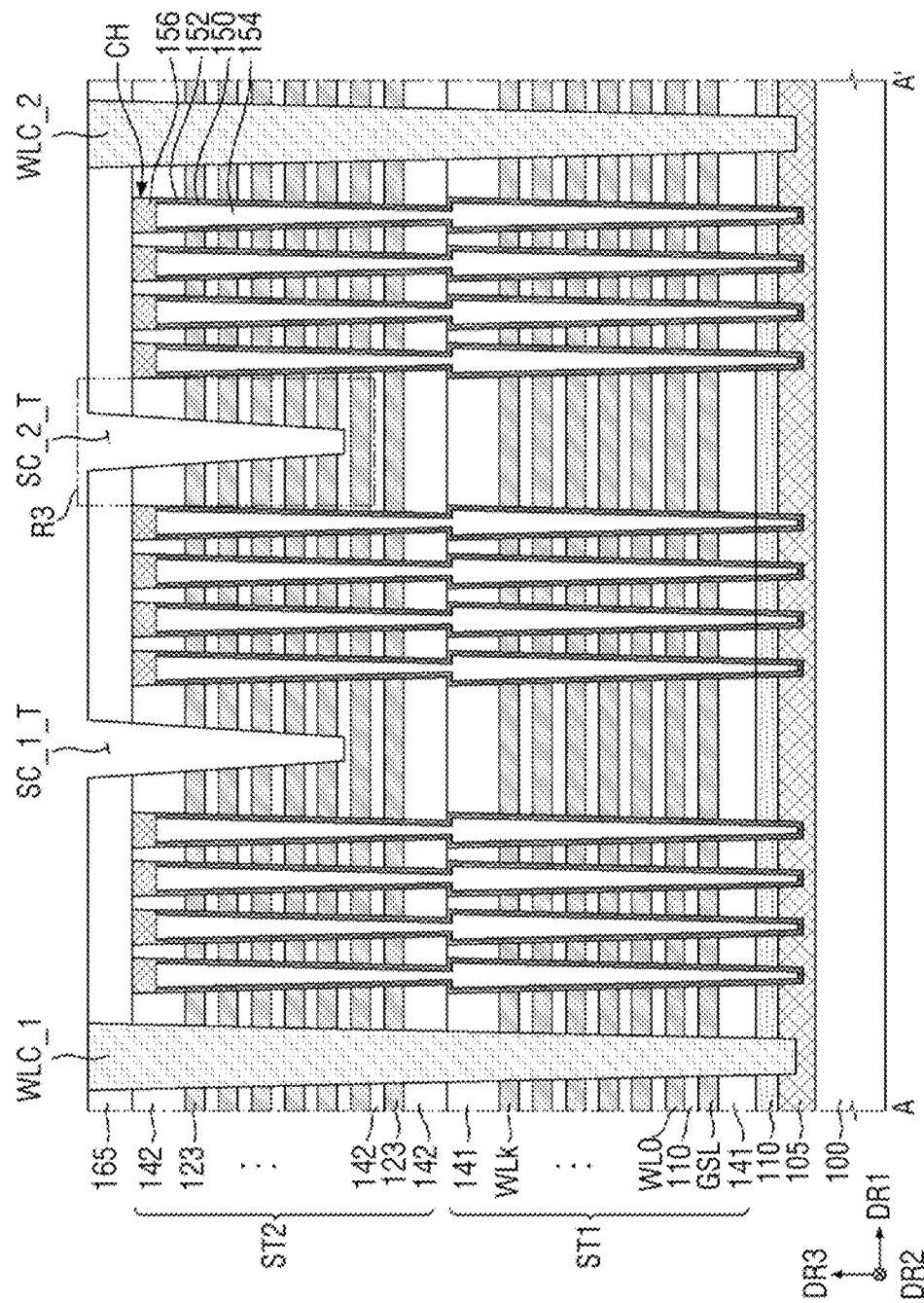

FIGS. 22 to 25 are enlarged views of R3 of FIG. 21, and are views in which the barrier conductive film 147 and the insulating film 146 of FIG. 8 are omitted for convenience of explanation.

Figure 22:
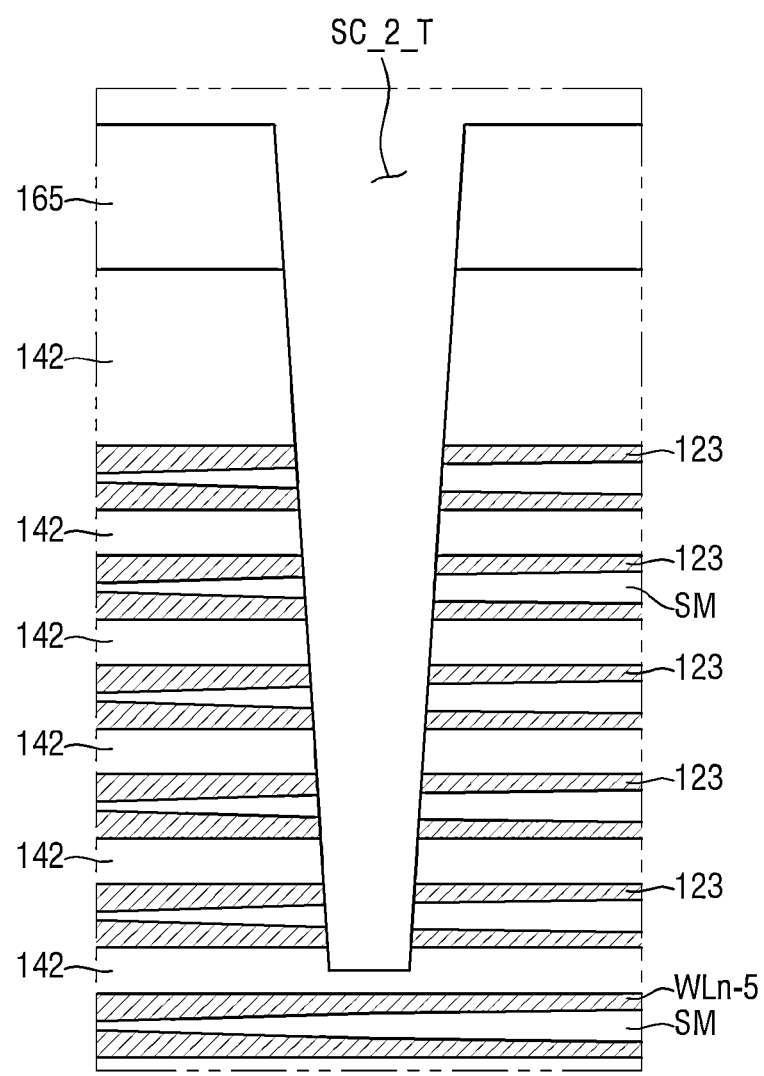

Referring to FIG. 22, seams SM may be present in the second preliminary gate electrode layers 123. The second preliminary gate electrode layers 123 are formed by the above-described replacement process. In this case, the conductive material may not be completely filled in the spaces from which the sacrificial layers are removed, and empty spaces, that is, seams SM, may thus be formed in the second preliminary gate electrode layers 123.

Figure 23:
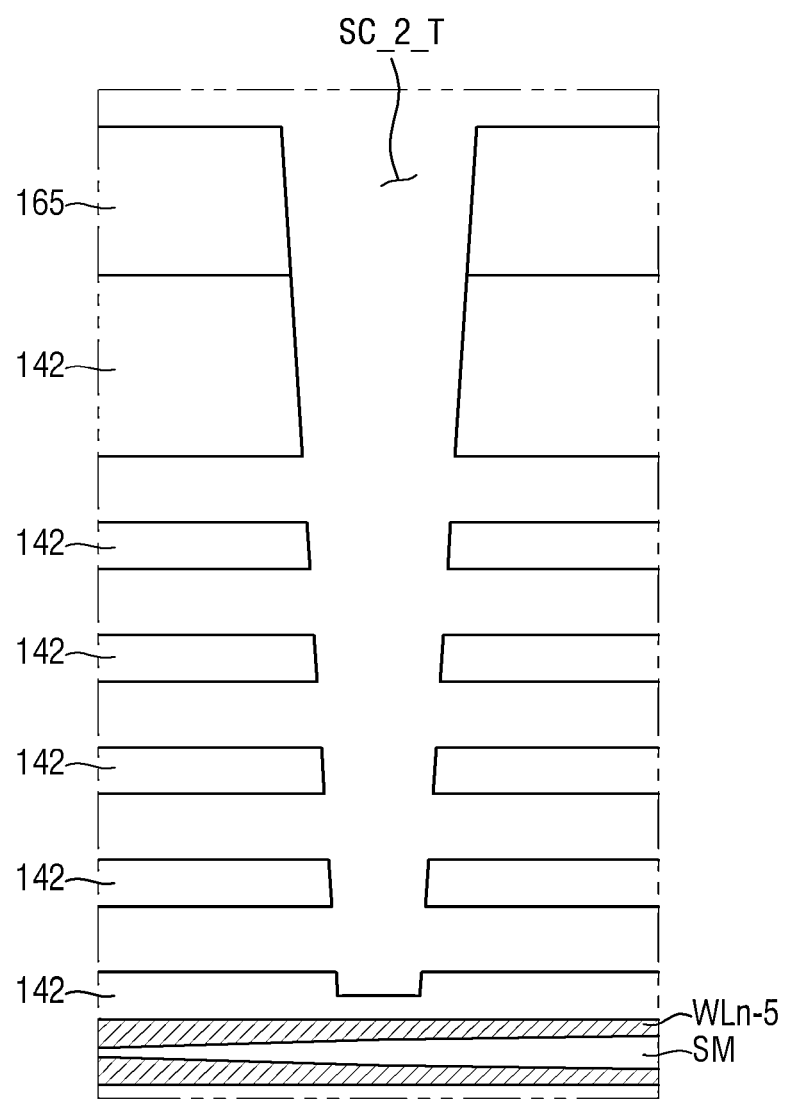

Referring to FIG. 23, at least portions of the second preliminary gate electrode layers 123 cut by each of the first and second gate cutting structure trenches SC_1_T and SC_2_T may be removed to expose the second inter-electrode insulating layers 142. That is, removing at least portions of the second preliminary gate electrode layers 123 may include removing at least portions of the seams SM. A method of removing the second preliminary gate electrode layers 123 is not particularly limited as long as a conductive material and/or an insulating material may be removed, but may be a method of performing isotropic etching or anisotropic etching on the second preliminary gate electrode layers 123. As a material for removing the second preliminary gate electrode layers 123, for example, a material including nitride may be used.

In this case, the second preliminary gate electrode layer 123 in the second gate cutting structure trench SC_2_T may be entirely or partially removed in the first direction DR1. Accordingly, at least one side surfaces of the second inter-electrode insulating layers 142 may be exposed.

Figure 24:
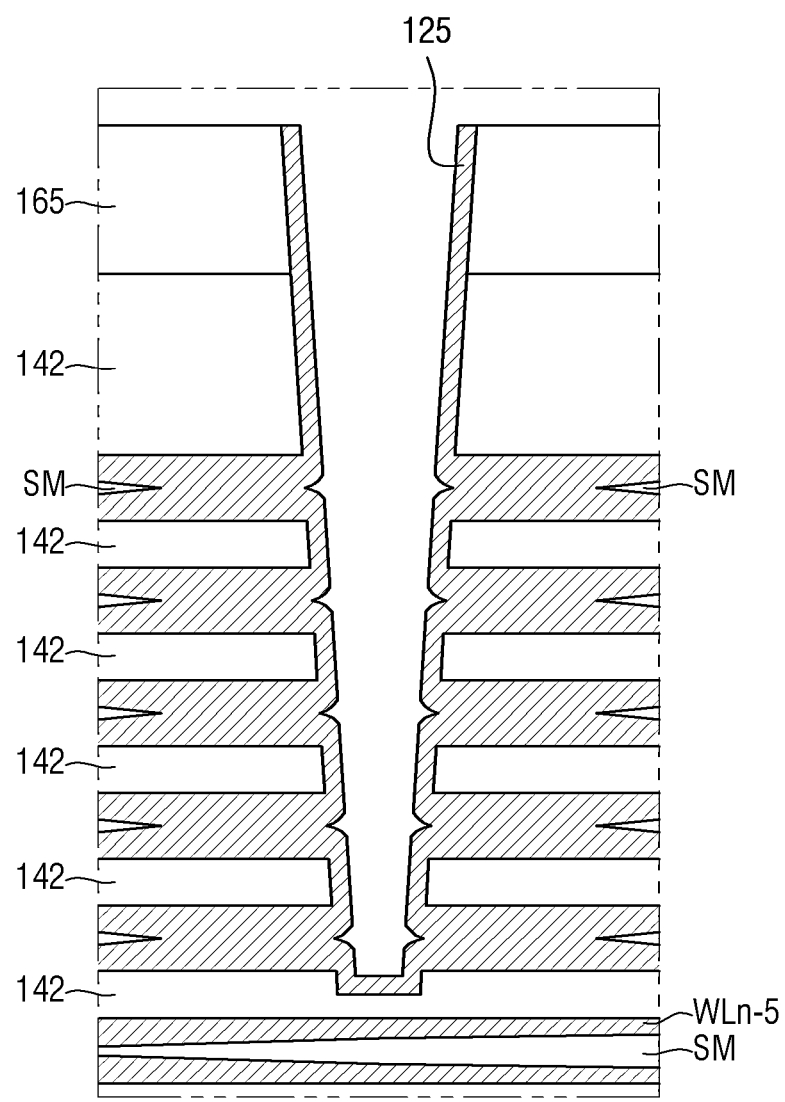

Referring to FIG. 24, a conductive material 125 may be formed on the exposed second inter-electrode insulating layers 142. A method of forming the conductive material 125 is not limited, but the conductive material 125 may be formed using, for example, an atomic layer deposition (ALD) method. In this case, the conductive material 125 may be formed to be recessed along inner portions of spaces in which the second inter-electrode insulating layers 142 are removed.

Meanwhile, the conductive material 125 is filled toward the inner portions of the spaces in which the second inter-electrode insulating layers 142 are removed, such that a filling rate of the conductive material 125 may decrease toward the inner portions of the spaces. In this case, the seams SM may be formed in second gate electrode layers WLn, WLn−1, WLn−2, WLn−3, and WLn−4 (see FIG. 25). However, even in this case, a filling rate of the conductive material 125 may be higher in the second gate electrode layers WLn, WLn−1, WLn−2, WLn−3, and WLn−4 (see FIG. 25) than in a second gate electrode layer WLn−5 (see FIG. 25) that is not penetrated by the second gate cutting structure trench SC_2_T. That is, a ratio of a region occupied by the seam SM may be smaller in the second gate electrode layers WLn, WLn−1, WLn−2, WLn−3, and WLn−4 (see FIG. 25) than in the second gate electrode layer WLn−5 (see FIG. 25) that is not penetrated by the second gate cutting structure trench SC_2_T.

Referring to FIG. 25, the second gate electrode layers WLn, WLn−1, WLn−2, WLn−3, and WLn−4 (see FIG. 25) may be formed so that the conductive materials 125 (see FIG. 24) of separate, respective second gate electrode layers WLn, WLn−1, WLn−2, WLn−3, and WLn−4 are spaced apart from each other (e.g., isolated from direct contact with each other) in the third direction DR3.

That is, the conductive material 125 may be removed to form the second gate electrode layers WLn, WLn−1, WLn−2, WLn−3, and WLn−4 (see FIG. 25). A method of removing the conductive material 125 is not limited, but the conductive material 125 may be removed by, for example, isotropic etching.

When the conductive material 125 (see FIG. 24) is removed by the isotropic etching, recesses R in which the second gate electrode layers WLn, WLn−1, WLn−2, WLn−3, and WLn−4 (see FIG. 25) are recessed (e.g., a side surface of a given second gate electrode layer may be recessed in a first direction DR1 away from a proximate sidewall of a proximate trench of the first and second gate cutting structure trenches SC_1_T and SC_2_T) may be formed between the second gate electrode layers WLn, WLn−1, WLn−2, WLn−3, and WLn−4 (see FIG. 25) and the second gate cutting structure SC_2.

Therefore, the second gate electrode layers WLn, WLn−1, WLn−2, WLn−3, and WLn−4 (see FIG. 25) may be formed to be spaced apart from each other in the third direction DR3 with respect to the second gate cutting structure SC_2. In addition, when the conductive material 125 (see FIG. 24) is removed by the isotropic etching, a process of removing the conductive material remaining around the second interelectrode insulating layers 142 may be performed simultaneously with the isotropic etching.

Subsequently, the recesses R may be filled with an insulating material. A type of the insulating material is not limited, but may include, for example, oxide (e.g., silicon oxide). As shown, the first and second gate cutting structure trenches SC_1_T and SC_2_T may be filled (e.g., with insulating material, such as silicon oxide) to form the first and second gate cutting structures SC_1 and SC_2.

Figure 26:
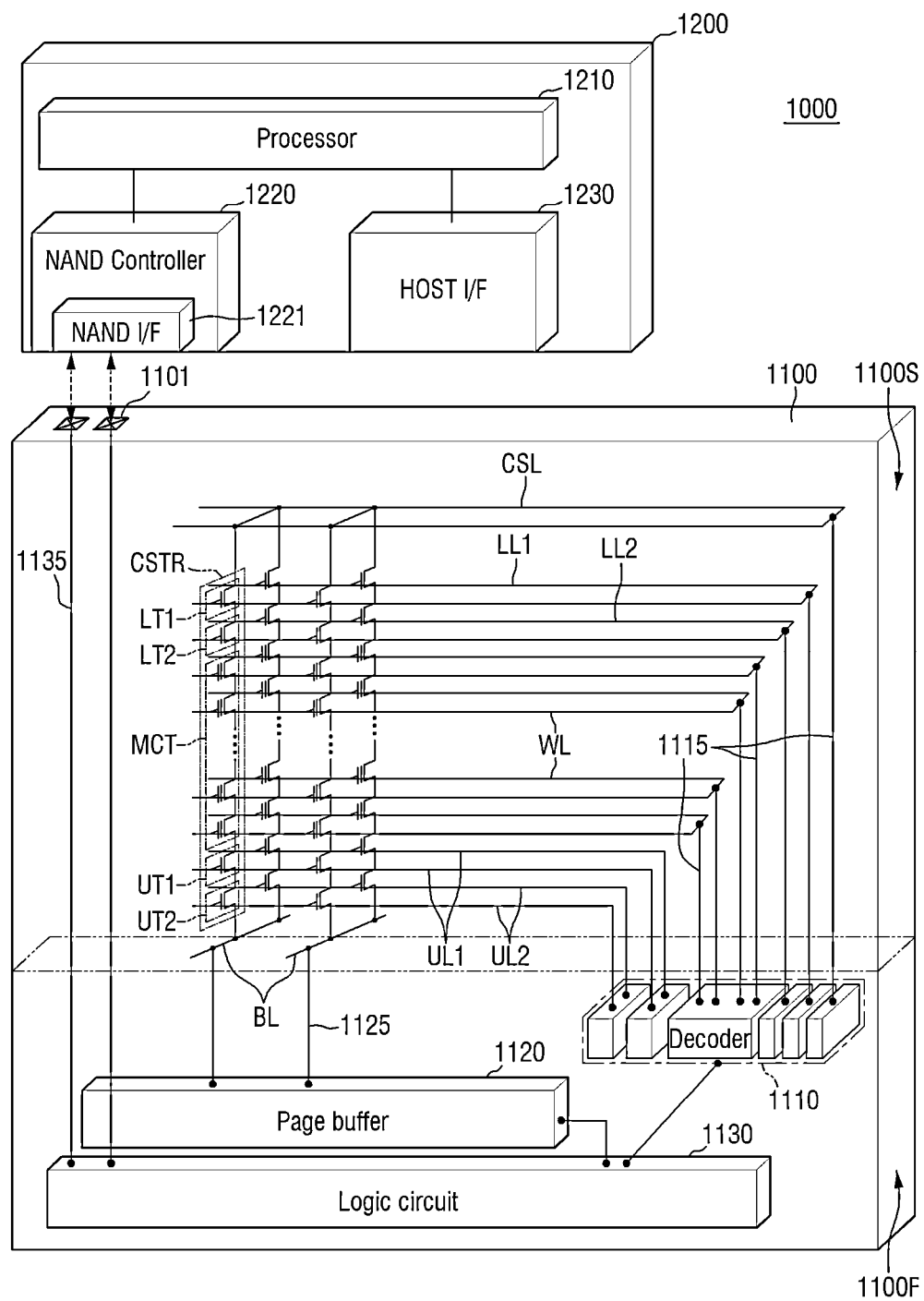
FIG. 26 is an example block diagram of a semiconductor memory system including a semiconductor memory device according to some example embodiments.
Figure 27:
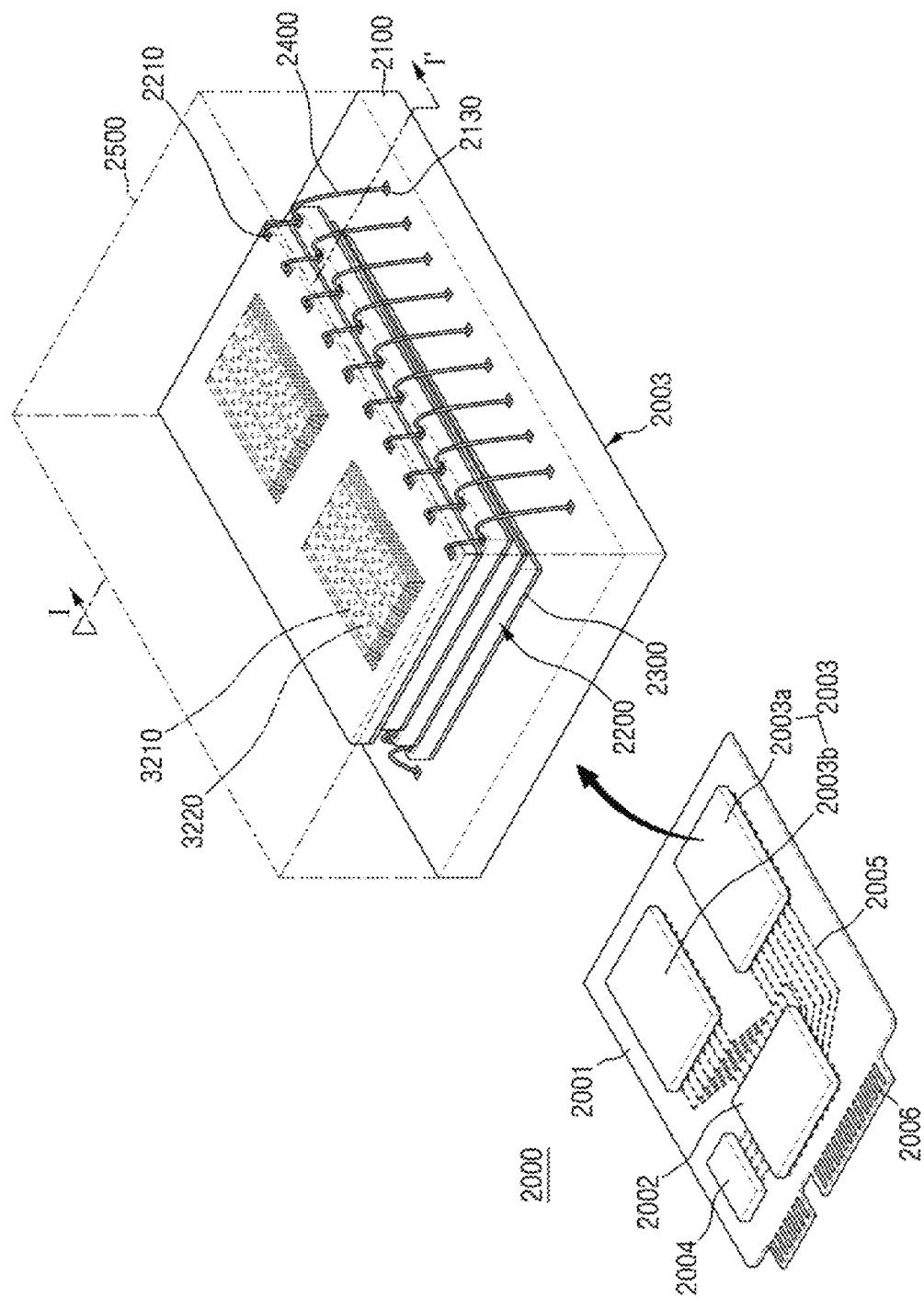
FIG. 27 is an example perspective view of a semiconductor memory system including a semiconductor memory device according to some example embodiments.
Figure 28:
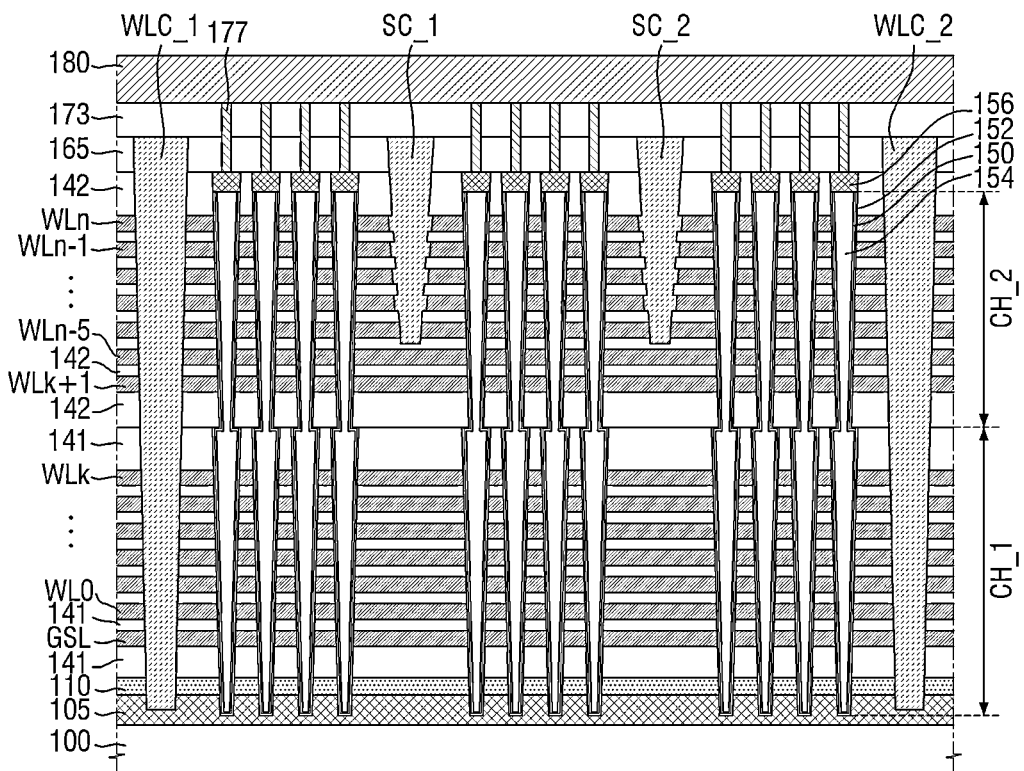
FIG. 28 is an example cross-sectional view taken along line I-I' of a semiconductor memory package of FIG. 27 including the semiconductor memory device according to some example embodiments.
Figure 28:
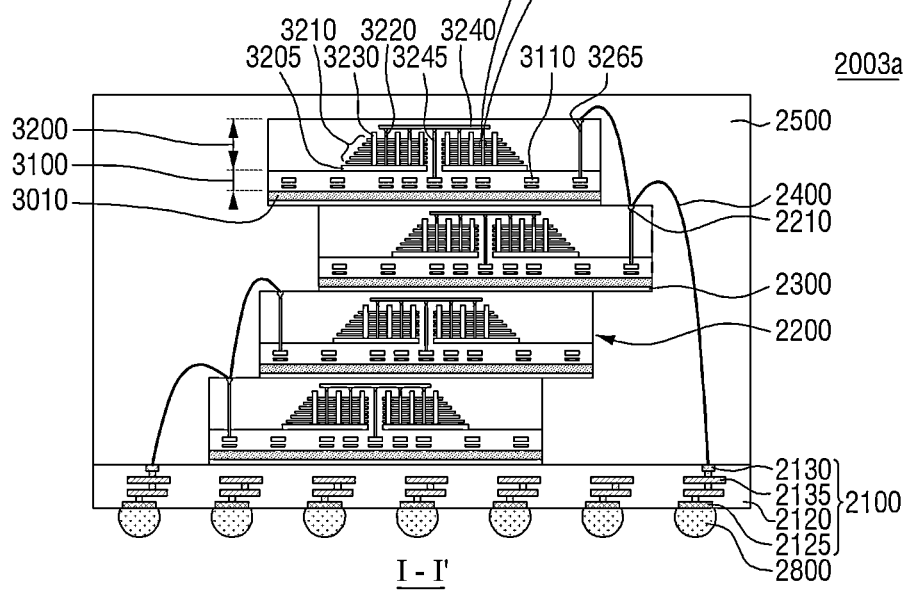

FIG. 26 is an example block diagram of a semiconductor memory system including a semiconductor memory device according to some example embodiments. FIG. 27 is an example perspective view of a semiconductor memory system including a semiconductor memory device according to some example embodiments. FIG. 28 is an example cross-sectional view taken along line I-I' of a semiconductor memory package of FIG. 27 including the semiconductor memory device according to some example embodiments.

Referring to FIG. 26, a semiconductor memory system 1000 according to some example embodiments may include a semiconductor device 1100 and a controller 1200 electrically connected to the semiconductor device 1100. The semiconductor memory system 1000 may be a storage device including one semiconductor device 1100 or a plurality of semiconductor devices 1100 or an electronic device including the storage device. For example, the semiconductor memory system 1000 may be a solid state drive (SSD) device, a universal serial bus (USB), a computing system, a medical device, or a communication device including one semiconductor device 1100 or a plurality of semiconductor devices 1100.

The semiconductor device 1100 may be a nonvolatile memory device, for example, a NAND flash memory device. The semiconductor device 1100 may include a first structure 1100F and a second structure 1100S on the first structure 1100F. In some example embodiments, the first structure 1100F may also be disposed next to the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between the bit lines BL and the common source line CSL.

In the second structure 1100S, each of the memory cell strings CSTR may include lower transistors LT1 and LT2 adjacent to the common source line CSL, upper transistors UT1 and UT2 adjacent to the bit lines BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously modified according to some example embodiments.

In some example embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some example embodiments, the lower transistors LT1 and LT2 may include a lower erase control transistor LT1 and a ground selection transistor LT2 connected to each other in series. The upper transistors UT1 and UT2 may include a string selection transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a gate induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 extending from the first structure 110F to the second structure 1100S. The bit lines BL may be electrically connected to the page buffer 1120 through second connection wirings 1125 extending from the first structure 110F to the second structure 1100S.

In the first structure 110F, the decoder circuit 1110 and the page buffer 1120 may execute a control operation for at least one of the plurality of memory cell transistors MCT. The decoder circuit 1110 and the page buffer 1120 may be controlled by the logic circuit 1130. The semiconductor device 1100 may communicate with the controller 1200 through input/output pads 1101 electrically connected to the logic circuit 1130. The input/output pads 1101 may be electrically connected to the logic circuit 1130 through input/output connection wirings 1135 extending from the first structure 1100F to the second structure 1100S.

The controller 1200 may include a processor 1210, a NAND controller 1220, and a host interface 1230. According to some example embodiments, the semiconductor memory system 1000 may include a plurality of semiconductor devices 1100, and in this case, the controller 1200 may control the plurality of semiconductor devices 1100.

The processor 1210 may control a general operation of the semiconductor memory system 1000 including the controller 1200. The processor 1210 may operate according to predetermined firmware, and may access the semiconductor device 1100 by controlling the NAND controller 1220. The NAND controller 1220 may include a NAND interface 1221 processing communication with the semiconductor device 1100. A control command for controlling the semiconductor device 1100, data to be written to the memory cell transistors MCT of the semiconductor device 1100, data to be read from the memory cell transistors MCT of the semiconductor device 1100, and the like, may be transmitted through the NAND interface 1221. The host interface 1230 may provide a communication function between the semiconductor memory system 1000 and an external host. When a control command is received from the external host through the host interface 1230, the processor 1210 may control the semiconductor device 1100 in response to the control command.

Referring to FIG. 27, a semiconductor memory system 2000 according to some example embodiments includes a main board 2001 and a controller 2002, one or more nonvolatile memory packages 2003, and a dynamic random access memory (DRAM) 2004 that are mounted on the main board 2001. The nonvolatile memory package 2003 and the DRAM 2004 may be connected to the controller 2002 by wiring patterns 2005 formed on the main board 2001.

The main board 2001 may include a connector 2006 including a plurality of pins coupled to an external host. The number and arrangement of the plurality of pins in the connector 2006 may vary depending on a communication interface between the semiconductor memory system 2000 and the external host. In some example embodiments, the semiconductor memory system 2000 may communicate with the external host according to any one of interfaces such as universal serial bus (USB), peripheral component interconnect express (PCI-Express), serial advanced technology attachment (SATA), and M-Phy for universal flash storage (UFS). In some example embodiments, the semiconductor memory system 2000 may operate by power supplied from the external host through the connector 2006. The semiconductor memory system 2000 may further include a power management integrated circuit (PMIC) for distributing the power supplied from the external host to the controller 2002 and the nonvolatile memory package 2003.

The controller 2002 may write data to or read data from the nonvolatile memory package 2003, and may improve an operation speed of the semiconductor memory system 2000.

The DRAM 2004 may be a buffer memory for alleviating a speed difference between the nonvolatile memory package 2003, which is a data storage space, and the external host. The DRAM 2004 included in the semiconductor memory system 2000 may operate as a kind of cache memory, and may provide a space for temporarily storing data in a control operation for the nonvolatile memory package 2003. When the semiconductor memory system 2000 includes the DRAM 2004, the controller 2002 may further include a DRAM controller for controlling the DRAM 2004, in addition to a NAND controller for controlling the nonvolatile memory package 2003.

The nonvolatile memory package 2003 may include first and second semiconductor memory packages 2003a and 2003b spaced apart from each other. Each of the first and second semiconductor memory packages 2003a and 2003b may be a semiconductor memory package including a plurality of semiconductor chips 2200. Each of the first and second semiconductor memory packages 2003a and 2003b may include a package substrate 2100, semiconductor chips 2200 on the package substrate 2100, adhesive layers 2300 disposed on lower surfaces of each of the semiconductor chips 2200, connection structures 2400 electrically connecting the semiconductor chips 2200 to the package substrate 2100, and a molding layer 2500 covering the semiconductor chips 2200 and the connection structures 2400 on the package substrate 2100.

The package substrate 2100 may be a printed circuit board including package upper pads 2130. The package substrate 2100 may include a package substrate body part 2120, the package upper pads 2130 disposed on an upper surface of the package substrate body part 2120, lower pads 2125 disposed on or exposed through a lower surface of the package substrate body part 2120, and internal wirings 2135 electrically connecting the package upper pads 2130 and the lower pads 2125 to each other in the package substrate body part 2120. The package upper pads 2130 may be electrically connected to the connection structures 2400. The lower pads 2125 may be connected to the wiring patterns 2005 of the main board 2001 of the semiconductor memory system 2000 as illustrated in FIG. 27 through conductive connectors 2800.

Each semiconductor chip 2200 may include input/output pads 2210. The input/output pads 2210 may correspond to the input/output pads 1101 of FIG. 26. Each of the semiconductor chips 2200 may include gate stack structures 3210 and memory channel structures 3220. Each of the semiconductor chips 2200 may include the above-described semiconductor memory device.

In some example embodiments, the connection structures 2400 may be bonding wires electrically connecting the input/output pads 2210 to the package upper pads 2130. Accordingly, in each of the first and second semiconductor memory packages 2003a and 2003b, the semiconductor chips 2200 may be electrically connected to each other by a bonding wire method, and be electrically connected to the package upper pads 2130 of the package substrate 2100. According to some example embodiments, in each of the first and second semiconductor memory packages 2003a and 2003b, the semiconductor chips 2200 may be electrically connected to each other by connection structures including through silicon vias (TSVs) instead of the bonding wire-type connection structures 2400.

In some example embodiments, the controller 2002 and the semiconductor chips 2200 may be included in one package. In some example embodiments, the controller 2002 and the semiconductor chips 2200 may be mounted on a separate interposer substrate different from the main board 2001, and the controller 2002 and the semiconductor chips 2200 may be connected to each other by wirings formed on the interposer substrate.

Referring to FIG. 28, in the semiconductor memory package 2003a, the package substrate 2100 may be a printed circuit board. The package substrate 2100 may include a package substrate body part 2120, package upper pads 2130 (see FIG. 27) disposed on an upper surface of the package substrate body part 2120, lower pads 2125 disposed on or exposed through a lower surface of the package substrate body part 2120, and internal wirings 2135 electrically connecting the package upper pads 2130 and the lower pads 2125 to each other in the package substrate body part 2120. The package upper pads 2130 may be electrically connected to the connection structures 2400. The lower pads 2125 may be connected to the wiring patterns 2005 of the main board 2001 of the semiconductor memory system 2000 as illustrated in FIG. 27 through conductive connectors 2800.

Each of the semiconductor chips 2200 may include a semiconductor substrate 3010 and a first structure 3100 and a second structure 3200 that are sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, memory channel structures 3220 and separation structures 3230 penetrating through the gate stack structure 3210, bit lines 3240 electrically connected to the memory channel structures 3220, and first connection wiring 1115 (see FIG. 26) electrically connected to word lines WL (see FIG. 26) of the gate stack structure 3210. Each of the first structure 3100, the second structure 3200, and the semiconductor chips 2200 includes: a cell unit CU including a stack structure ST and a channel structure CH penetrating through the stack structure ST, the stack structure ST being formed on a substrate 100, extending in a first direction DR1, and including at least one string selection gate and a plurality of cell gates; a plurality of cell separation structures WLC separating the cell unit CU in the first direction DR1; and a plurality of gate cutting structures SC defining regions within the cell unit CU between the plurality of cell separation structures WLC, as illustrated in an enlarged view of FIG. 28. Here, the cell unit CU includes a first region between at least one cell separation structure WLC and the gate cutting structure SC and a second region between the plurality of gate cutting structures SC, and a ratio of a region of the stack structure ST occupied by a conductive material in the second region is greater in the string selection gate than in the cell gate.

Each of the semiconductor chips 2200 may include through wirings 3245 electrically connected to the peripheral wirings 3110 of the first structure 3100 and extending into the second structure 3200. Referring to FIG. 28, the through wirings 3245 may penetrate through the gate stack structure 3210 and be disposed outside the gate stack structure 3210. Each of the semiconductor chips 2200 may further include input/output connection wirings 3265 electrically connected to the peripheral wirings 3110 of the first structure 3100 and extending into the second structure 3200 and the input/output pads 2210 electrically connected to the input/output connection wiring 3265. The semiconductor chips 2200 of FIG. 28 may be electrically connected to each other by the connection structures 2400 having a bonding wire form. However, in some example embodiments, semiconductor chips in one semiconductor memory package, such as the semiconductor chips 2200 of FIG. 28 may be electrically connected to each other by connection structures including through silicon vias (TSVs).

As described herein, any devices, packages, systems, electronic devices, blocks, modules, units, controllers, circuits, and/or portions thereof according to any of the example embodiments, and/or any portions thereof (including, without limitation, semiconductor memory system 1000, semiconductor device 1100, controller 1200, decoder circuit 1110, page buffer 1120, logic circuit 1130, processor 1210, NAND controller 1220, host interface 1230, semiconductor memory system 2000, main board 2001, controller 2002, nonvolatile memory package 2003, DRAM 2004, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, packages, systems, electronic devices, blocks, modules, units, controllers, circuits, and/or portions thereof according to any of the example embodiments, and/or any portions thereof.

Any of the memories and/or storage devices described herein, including, without limitation, nonvolatile memory package 2003, DRAM 2004, or the like, may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (Re-RAM), or a ferro-electric RAM (FRAM), or a volatile memory, such as a static RAM (SRAM), a dynamic RAM (DRAM), or a synchronous DRAM (SDRAM).

In concluding the detailed description, those skilled in the art will appreciate that many variations and modifications can be made to the example embodiments without substantially departing from the principles of the present inventive concepts. Therefore, some example embodiments of the inventive concepts are used in a generic and descriptive sense only and not for purposes of limitation.

What is claimed is:

1. A semiconductor memory device, comprising:
a cell unit including a stack structure and a channel structure penetrating through the stack structure, the stack structure being on a substrate, the stack structure extending in a first direction, the stack structure including at least one string selection gate and a plurality of cell gates;
a plurality of cell separation structures separating the cell unit in the first direction; and
a plurality of gate cutting structures defining regions within the cell unit between adjacent cell separation structures of the plurality of cell separation structures,
wherein the cell unit includes
a first region defined between a first cell separation structure of the plurality of cell separation structures and a first gate cutting structure of the plurality of gate cutting structures, and
a second region defined between the first gate cutting structure and a second gate cutting structure of the plurality of gate cutting structures, the first and second gate cutting structures being adjacent gate cutting structures, and
wherein a ratio of a region of the at least one string selection gate that is occupied by a conductive material in the second region is greater than a ratio of a region of at least one cell gate of the plurality of cell gates that is occupied by the conductive material in the second region.

2. The semiconductor memory device of claim 1, wherein the stack structure includes a first seam in the at least one string selection gate and a second seam in the at least one cell gate, and a ratio of a region of the at least one string selection gate that is occupied by the first seam in the second region is smaller than a ratio of a region of the at least one cell gate that is occupied by the second seam in the second region.

3. The semiconductor memory device of claim 2, wherein the first seam in the at least one string selection gate in the second region is spaced apart from the first gate cutting structure in the first direction.

4. The semiconductor memory device of claim 2, wherein the second seam overlaps the first gate cutting structure in a second direction intersecting the first direction.

5. The semiconductor memory device of claim 2, wherein
a size of the first seam in the first region decreases with increasing proximity to the first gate cutting structure, and
a size of the second seam in the first region increases with increasing proximity to the first gate cutting structure.

6. The semiconductor memory device of claim 2, wherein the first seam in the first region is isolated from one side surface of the at least one string selection gate that is adjacent to the first cell separation structure.

7. The semiconductor memory device of claim 2, wherein the first seam in the first region is exposed to one side surface of the at least one string selection gate that is adjacent to the first cell separation structure.

8. The semiconductor memory device of claim 1, wherein
a side surface of the at least one string selection gate at least partially defines a recess between the at least one string selection gate and the first gate cutting structure, and
the recess is filled with an insulating material.

9. The semiconductor memory device of claim 1, wherein
the stack structure includes an upper stack structure and a lower stack structure each including gate electrode layers and a plurality of inter-electrode insulating layers that are stacked alternately, and
the channel structure includes an information storage pattern and a semiconductor pattern sequentially extending along a profile of a channel hole penetrating through the upper and lower stack structures.

10. A semiconductor memory device, comprising:
a cell unit including upper and lower stack structures and a channel structure penetrating through the upper and lower stack structures in a first direction, the upper and lower stack structures being on a substrate, the upper and lower stack structures each extending in a second direction intersecting the first direction, each of the upper stack structure and the lower stack structure including gate electrode layers including at least one string selection gate and a plurality of cell gates;
a plurality of cell separation structures separating the cell unit in the second direction; and
a plurality of gate cutting structures defining regions within the cell unit between adjacent cell separation structures of the plurality of cell separation structures,
wherein a side surface of the at least one string selection gate of the upper stack structure at least partially defines a recess between the at least one string selection gate and one gate cutting structure of the plurality of cell separation structures, and
wherein the recess is filled with an insulating material.

11. The semiconductor memory device of claim 10, wherein
the cell unit includes
a first region defined between a first cell separation structure of the plurality of cell separation structures and a first gate cutting structure of the plurality of gate cutting structures, and
a second region defined between the first gate cutting structure and a second gate cutting structure of the plurality of gate cutting structures, the first and second gate cutting structures being adjacent gate cutting structures, and a ratio of a region of the at least one string selection gate of at least one stack structure of the upper and lower stack structures that is occupied by a conductive material in the second region is greater than a ratio of a region of at least one cell gate of the plurality of cell gates of the at least one stack structure that is occupied by the conductive material in the second region.

12. The semiconductor memory device of claim 11, wherein
each stack structure of the upper and lower stack structures of the cell unit includes a first seam in the at least one string selection gate of the stack structure and a second seam in the at least one cell gate of the stack structure, and
a ratio of a region of the at least one string selection gate of the at least one stack structure that is occupied by the first seam in the second region is smaller than a ratio of a region of the at least one cell gate of the at least one stack structure that is occupied by the second seam in the second region.

13. The semiconductor memory device of claim 12, wherein the first seam of the at least one string selection gate of the at least one stack structure in the second region is spaced apart from the first gate cutting structure.

14. The semiconductor memory device of claim 12, wherein
a size of the first seam of the at least one string selection gate of the at least one stack structure in the first region decreases with increasing proximity to the first gate cutting structure, and
a size of the second seam of the at least one cell gate of the at least one stack structure in the first region increases with increasing proximity to the first gate cutting structure.

15. The semiconductor memory device of claim 12, wherein the first seam of the at least one string selection gate of the at least one stack structure in the first region is exposed to one side surface of the at least one string selection gate of the at least one stack structure that is adjacent to the first cell separation structure.

16. A method of fabricating a semiconductor memory device, comprising:
forming a first preliminary stack structure on a substrate, the first preliminary stack structure extending in a first direction and having first inter-electrode insulating layers and first sacrificial layers that are alternately stacked;
forming first channel holes penetrating through the first preliminary stack structure in a second direction that intersects the first direction;
forming a second preliminary stack structure on the first preliminary stacked structure, the second preliminary stack structure having second inter-electrode insulating layers and second sacrificial layers that are alternately stacked;
forming second channel holes penetrating through the second preliminary stack structure in the second direction;
forming a plurality of cell separation structures penetrating through both the first and second preliminary stack structures and separating a cell unit in the first direction;
removing the first and second sacrificial layers to form first gate electrode layers and second preliminary gate electrode layers;
forming a plurality of gate cutting structure trenches cutting the second preliminary gate electrode layers to define regions within the cell unit between the plurality of cell separation structures;

removing at least portions of the second preliminary gate electrode layers cut by each of the plurality of gate cutting structure trenches to expose the second inter-electrode insulating layers;

forming a conductive material on the exposed second inter-electrode insulating layers;

forming second gate electrode layers so that conductive materials of respective second gate electrode layers are spaced apart from each other in the second direction; and forming a plurality of gate cutting structures in the plurality of gate cutting structure trenches, such that the regions within the cell unit include
- a first region defined between a first cell separation structure of the plurality of cell separation structures and a first gate cutting structure of the plurality of gate cutting structures, and
- a second region defined between the first gate cutting structure and a second gate cutting structure of the plurality of gate cutting structures, the first and second gate cutting structures being adjacent gate cutting structures, wherein the second gate electrode layers include at least one string selection gate and a plurality of cell gates, and wherein a ratio of a region of the at least one string selection gate that is occupied by the conductive material in the second region is greater than a ratio of a region of at least one cell gate of the plurality of cell gates that is occupied by the conductive material in the second region.

17. The method of claim 16, wherein
the second preliminary gate electrode layers include seams, and
the removing of at least portions of the second preliminary gate electrode layers includes removing at least portions of the seams.

18. The method of claim 16, wherein
the second gate electrode layers include a first seam in the at least one string selection gate and a second seam in the at least one cell gate, and
a ratio of a region of the at least one string selection gate that is occupied by the first seam in the second region is smaller than a ratio of a region of the at least one cell gate that is occupied by the second seam in the second region.

19. The method of claim 18, wherein the first seam in the first region is exposed to one side surface of the at least one string selection gate that is adjacent to the first cell separation structure.

20. The method of claim 16, further comprising:
forming a recess based on recessing the at least one string selection gate between the string selection gate and a proximate sidewall of a proximate gate cutting structure trench of the plurality of gate cutting structure trenches; and
filling the recess with an insulating material.

* * * * *